United States Patent
de Vreede et al.

(10) Patent No.: US 12,294,360 B2
(45) Date of Patent: May 6, 2025

(54) DIGITAL TRANSMITTER WITH HIGH POWER OUTPUT

(71) Applicant: Technische Universiteit Delft, Delft (NL)

(72) Inventors: Leonardus Cornelis Nicolaas de Vreede, Delft (NL); Seyed Morteza Alavi, Delft (NL); Robert Jan Bootsman, Delft (NL); Mohammad Reza Beikmirza, Delft (NL); Dieuwert Peter Nicolaas Mul, Delft (NL); Rob Heeres, Nijmegen (NL); Freerk van Rijs, Nijmegen (NL)

(73) Assignee: Technische Universiteit Delft, Delft (NL)

( * ) Notice: Subject to any disclaimer, the term of this patent is extended or adjusted under 35 U.S.C. 154(b) by 404 days.

(21) Appl. No.: 17/798,601

(22) PCT Filed: Feb. 5, 2021

(86) PCT No.: PCT/NL2021/050081
§ 371 (c)(1),
(2) Date: Aug. 10, 2022

(87) PCT Pub. No.: WO2021/162545
PCT Pub. Date: Aug. 19, 2021

(65) Prior Publication Data
US 2023/0139209 A1    May 4, 2023

(30) Foreign Application Priority Data
Feb. 14, 2020   (NL) .................................. 2024903

(51) Int. Cl.
*H03K 17/68*        (2006.01)
*H03F 3/24*         (2006.01)
(Continued)

(52) U.S. Cl.
CPC ......... *H03K 17/6871* (2013.01); *H03F 3/245* (2013.01); *H03F 2200/451* (2013.01); *H04B 1/04* (2013.01)

(58) Field of Classification Search
CPC ................ H03K 17/6871; H03F 3/245; H03F 2200/451; H04B 1/04
(Continued)

(56) References Cited

U.S. PATENT DOCUMENTS 6,294,954 B1 *   9/2001   Melanson ...... H03K 19/018585
                                             330/10
2011/0129037 A1 * 6/2011   Staszewski ............. H03F 3/193
                                             375/316

FOREIGN PATENT DOCUMENTS

WO      2018/132006 A1    7/2018

\* cited by examiner

*Primary Examiner* — Kevin M Burd
(74) *Attorney, Agent, or Firm* — N.V. Nederlandsch Octrooibureau

(57) ABSTRACT

An RF transmitter (1) having a gate-segmented power output stage (2) and a digital driver (5). The gate-segmented power output stage (2) includes a field-effect transistor with a plurality of gate fingers (32) and drain fingers (31) that define a gate periphery. The field-effect transistor comprises a plurality of power output stage segments (3) that each correspond to a respective part of the gate periphery, and that each have a respective power output stage segment input (4). The digital driver (5) has control outputs (6) which are connected to corresponding ones of the respective power output stage segment inputs (4), and is configured for individually switching each of the power output stage segments (3) between an on mode and a cut-off mode in dependence of one or more input signals to obtain a modulated RF carrier signal at an output (7) of the gate-segmented power output stage (2).

28 Claims, 18 Drawing Sheets

(51) Int. Cl.
*H03K 17/687* (2006.01)
*H04B 1/04* (2006.01)

(58) Field of Classification Search
USPC .......................................................... 375/308
See application file for complete search history.

*Fig. 1* -- Prior Art --
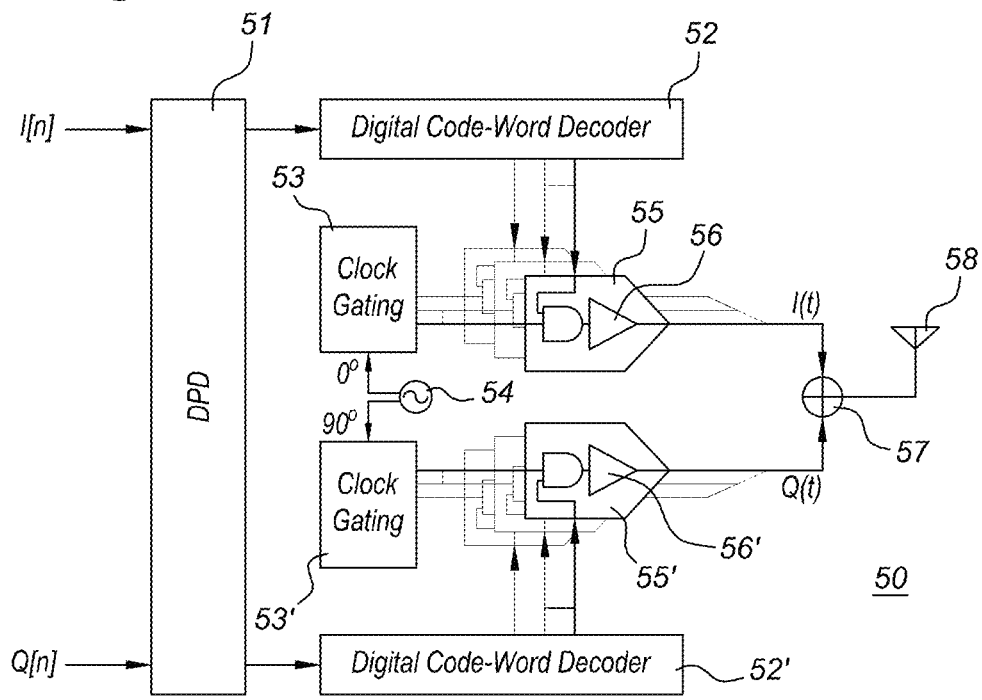
*Fig. 2* -- Prior Art --
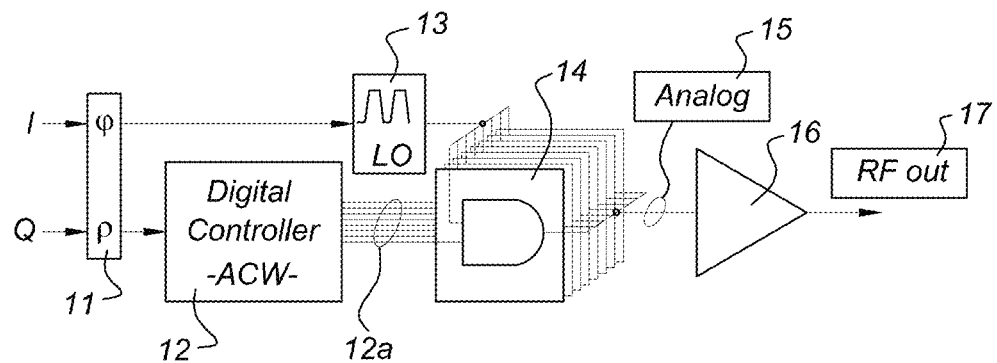

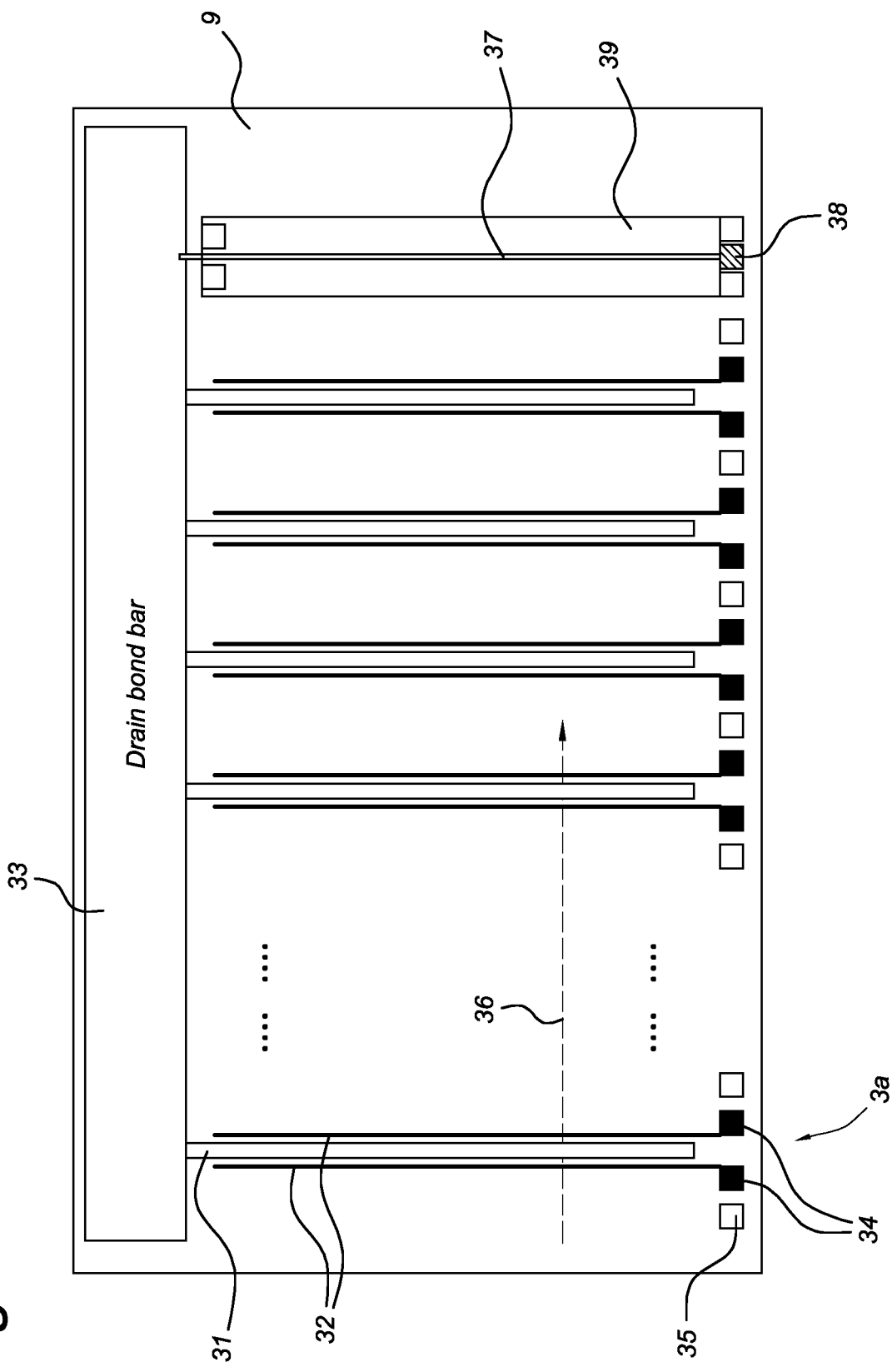

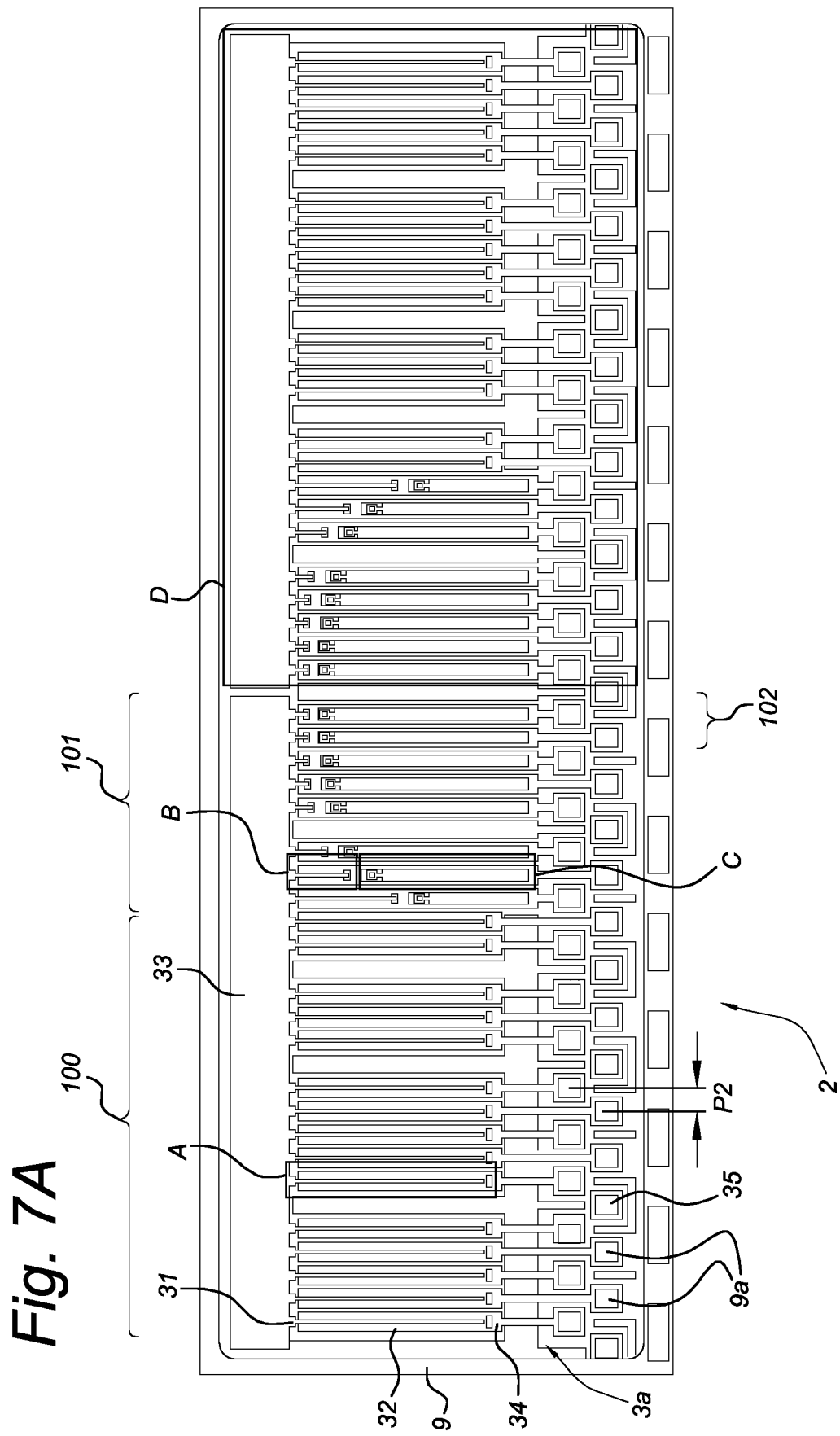

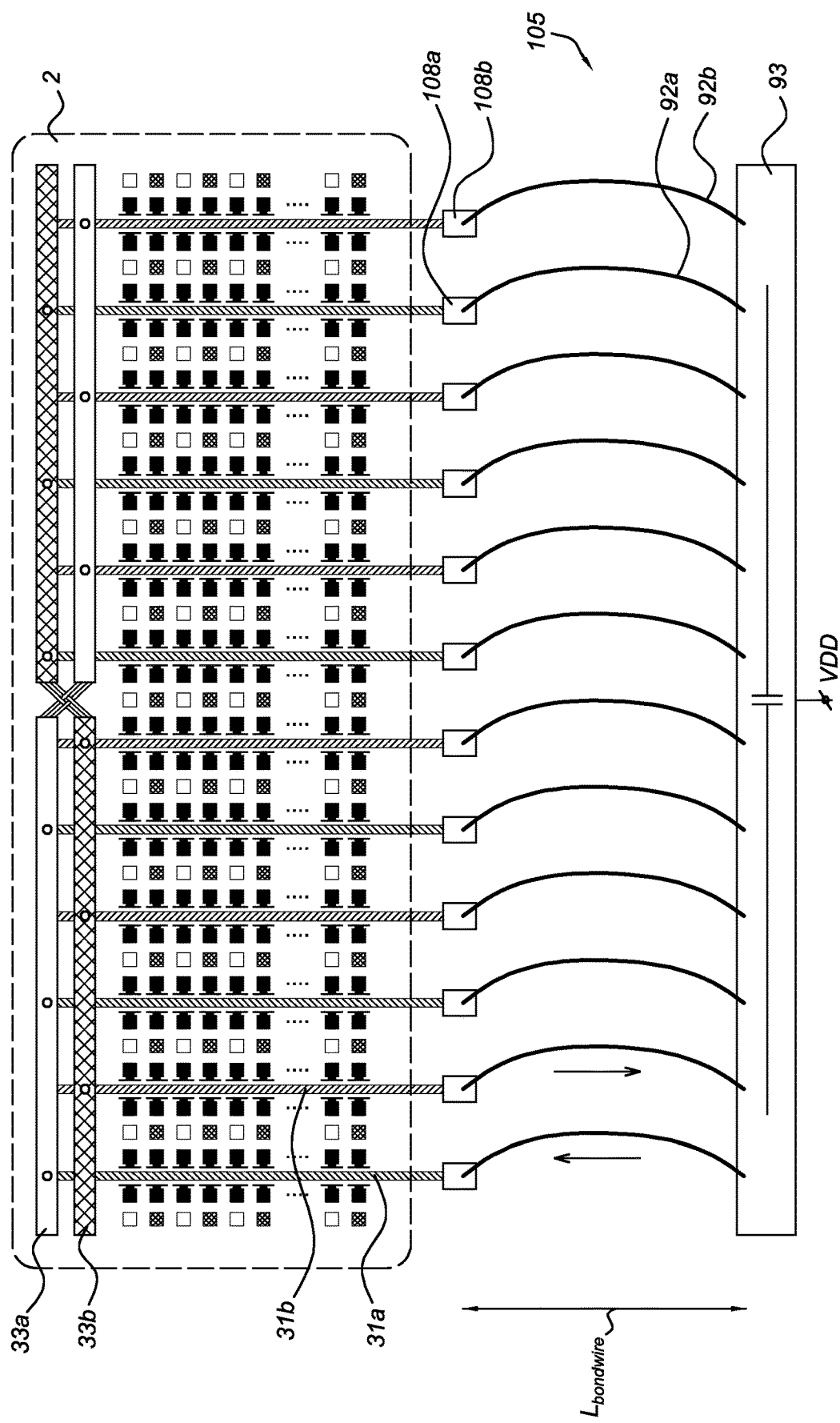

DIGITAL TRANSMITTER WITH HIGH POWER OUTPUT

FIELD OF THE INVENTION

The present invention relates to an RF transmitter, comprising a power output stage and a digital driver connected to the power output stage, specifically suitable for high-speed and high-power applications, such as 5G mMIMO base stations.

BACKGROUND ART

The article by V. Diddi et al. entitled "Broadband digitally-controlled power amplifier based on CMOS/GaN combination," 2016 IEEE Radio Frequency Integrated Circuits Symposium (RFIC), San Francisco, CA, 2016, pp. 258-261, discloses a digital RF power transmitter configuration with a control part and (single) amplifier stage, wherein the control part provides an analog signal to the power amplifier stage.

International patent publication WO2018/132006 discloses a digitally-controlled power amplifier (DPA) including a radio frequency digital-to-analog converter (RF-DAC) constructed from nonlinearly weighted power amplifier segments.

SUMMARY OF THE INVENTION

The present invention seeks to provide an improved RF transmitter implementation, which is specifically suited for high-speed, high-frequency, RF power applications, such as 5G massive Multiple Input Multiple Output (mMIMO) base stations.

According to the present invention, an RF transmitter is provided, comprising a gate-segmented power output stage, said power output stage comprising a field-effect transistor having a plurality of gate fingers and a plurality of drain fingers that define a gate periphery, the field-effect transistor comprising a plurality of power output stage segments that each correspond to a respective part of the gate periphery and that each have a respective power output stage segment input. The RF transmitter further comprises a digital driver having control outputs which are connected to corresponding ones of the respective power output stage segment inputs, the digital driver being configured for individually switching each of the power output stage segments between an on-mode and a cut-off mode, in dependence of one or more input signals, e.g. baseband signals in combination with one or more RF carrier signals and/or one or more RF reference clocks, to obtain a modulated RF carrier signal at an output of the gate-segmented power output stage.

Typically, a power field-effect transistor comprises a plurality of gate fingers and a plurality of drain fingers to realize the required output power. According to the present invention, the gate-segmented power output stage corresponds to a gate-segmented version of this large transistor. To this end, the transistor is segmented into a plurality of smaller power output stage segments. Each of these segments corresponds to a respective part of the gate periphery. For example, the field-effect transistor may comprise n gate fingers, each having a gate width of 1 mm. In this respect, it is noted that the gate fingers and drain fingers are elongated structures. The longitudinal direction of the gate finger will be referred to as the width direction. Hence, in the abovementioned example, the gate periphery corresponds to n×l mm. It is possible to segment the field-effect transistor into p power output stage segments each corresponding to a part of the gate periphery, for example to n×l/p mm.

Each power output stage segment may be formed by one or more of the plurality of gate fingers. For example, one or more adjacently arranged gate fingers can be grouped into a respective gate segment. Each power output stage segment may then correspond to one or more gate segments.

The one or more gate fingers may be arranged in a pattern consisting of parallel rows, wherein at least one row comprises a plurality of gate fingers, wherein the gate fingers in said at least one row are aligned such that their width directions are in line. Such pattern closely resembles that of an unsegmented power transistor. Furthermore, each row can be associated with an active area that is continuous in the width direction such that a single active area is provided for each row, wherein the active area corresponds to all gate fingers in that row.

The one or more gate fingers extend over a respective active area. More in particular, the one or more gate fingers are separated from the underlying semiconductor by a thin gate oxide. The thickness of the gate fingers is typically very small. To avoid high ohmic losses, thicker metal structures are used that also have the shape of fingers. These structures are connected to the gate fingers and are referred to as gate runners. Similar considerations hold for the drain fingers. These relatively thin fingers each form an ohmic contact to a respective drain region. Thicker finger shaped metal structures are then also used to minimize ohmic losses. As the shapes of the gate runners and gate fingers typically correspond, they will hereinafter both be referred to as gate fingers. Similar considerations hold for the drain fingers and the finger like metal structures connected to them.

Adjacent power output stage segments may share a drain finger.

The power field-effect transistor of the present invention preferably comprises a drain bar from which all drain fingers extend. For the efficient generation of power, it is preferred that the difference in phase delay associated with the various different paths inside the field-effect transistor is kept at a minimum. The present invention particularly relates to RF transmitters of which an operational frequency ranges from 1 GHz to 50 GHz and for which an absolute phase difference for signals propagating via adjacent power output stage segments from the respective power output stage segment input to the drain bar is less than 5 degrees at the operational frequency for each pair of adjacent power output stage segments.

Further embodiments are defined by the dependent claims as attached, and described below in the detailed description, together with the associated advantages.

SHORT DESCRIPTION OF DRAWINGS

The present invention will be discussed in more detail below, with reference to the attached drawings, in which FIG. 1 shows a block diagram of a prior-art Cartesian (low-power) fully-digital RF transmitter;

FIG. 2 shows a block diagram of a prior-art polar hybrid-digital/analog (power) transmitter;

FIG. 6 shows a conceptual top view of an embodiment of a LDMOS/GaN power die with a fully thermometer gate-segmented power output stage arranged to be edge-connected in accordance with the present invention;

FIG. 19 shows a schematic diagram of yet a further exemplary implementation of a switch bank in accordance with the present invention using a resonator comprising bond wires;

DESCRIPTION OF EMBODIMENTS

Figure 3:
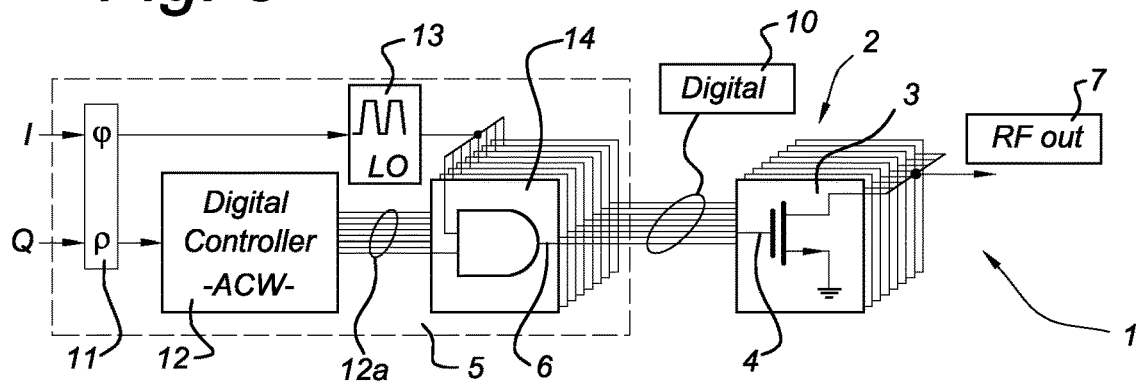
FIG. 3 shows a block diagram of an embodiment of a polar fully-digital power RF transmitter with a gate-segmented power output stage according to the present invention.

The present invention relates to the general need for low-cost, highly-integrated and energy-efficient transmitter (TX) line-ups for wireless applications like base stations and line drivers such as Data Over Cable Service Interface Specification (DOCSIS) drivers. The currently used analog-intensive TX solutions in these applications still suffer from poor integration, complicated design logistics, bandwidth limitations due to input and output impedance matching of their active devices, while having inherent linearity/efficiency trade-offs. Fully digital-TX (DTX) solutions can in theory offer higher integration and better RF performance than their analog counterparts at all of the mentioned aspects. However, so far, all DTX implementations reported, fail to meet the needs of DOCSIS and sub-6 GHz base stations, including the upcoming 5G mMIMO generation in terms of RF output power and efficiency.

Although DTX solutions have been the subject of research investigations over more than a decade, all DTX solutions reported fail to reach the output powers needed for commercial base-stations. This is true even for the new mMIMO base stations that use a lower output power per TX line-up (e.g. peak-powers ranging from 5 W-50 W, instead of the traditional macro-cell base station that use peak powers exceeding 100 W). For these base stations, in addition to the output power requirements, also an overall average (TX system) efficiency of 40% or higher is targeted.

To understand the output power—efficiency limitations in existing DTX solutions, it is important to know that all presently known Radio-Frequency Digital-to-Analog Converter (RFDAC) like DTX reported solutions make exclusively use of high-speed (low-voltage) digital CMOS/SOI technologies, since high-speed switching is mandatory for achieving DTX operation at RF frequencies. An example of an RFDAC-like DTX solution implemented in a high-speed, low-breakdown voltage technology can be found in [1] for a Cartesian concept targeting high video bandwidth for its transmit signals at moderate efficiencies. Another example of an RFDAC implementation that aims for higher peak efficiencies can be found in [2], which shows polar operation, an operation which is typically more restricted in terms of video bandwidth. RFDAC DTX concepts that aim for a better compromise between peak efficiency and video bandwidth have been also proposed and are based on the use of multiple RF clock phases [3]. In addition to this also RFDAC DTX concepts that use an efficiency enhancement technique to increase the average efficiency for complex modulated waveforms have been reported, like RFDAC based Doherty [4], as well as RFDAC based outphasing.

However, the use of these high-speed low-voltage breakdown (e.g. 1.1-2.5V) CMOS/SOI technologies also in their output stages, directly limits them in using higher voltage swings at their output stages, and consequently in reaching the required power levels for base stations. Attempts to reach higher output powers with DTX concepts, e.g. by using device stacking in the output stage, power combining, combinations with thicker-gate-oxide devices, or the use of switched capacitor concepts, improves the output power in these works to some extent, but also results in higher circuit complexity in their final output stages (sometimes referred to sub-PAs), with all its associated parasitics. Since reaching good TX system efficiency and output power is strongly negatively affected by these circuit parasitics, all reported DTX solutions reported have been limited in their peak output power capabilities to at most a few watts. These power and efficiency limitations, combined with the limited number of effective bits that can be reached for DTX configurations that aim for higher output powers (limiting the dynamic range) are the reasons that up to date, all base stations are analog in nature for their TX path, especially when it comes to the final power amplifier. Attempts to digitalize the TX path more and more, e.g. by using RFDAC drivers are on-going but so far all fail to include the final PA stage [6]. Also visionary articles or existing patents, simply give no clue on how to implement the required sub-PAs at sufficient power levels.

In view of this, FIG. 1 shows a block diagram of a prior art Cartesian digital transmitter 50, in which the digital baseband I[n] and Q[n] data are first fed to a digital pre-distorter (DPD) 51. This element passes the pre-corrected digital baseband data to digital decoders 52, 52' that control the clock-gating circuits 53, 53' that utilize a RF carrier 54, and the sub-RFDACs 55, 55'/sub-PAs 56, 56' to generate the analog output signals I(t) and Q(t), which are combined in combiner 57 and fed to the antenna 58. However, any publically available information on how to reach higher power levels at RF frequencies with high efficiency using these sub-RFDACs 55, 55', 56, 56' is missing. Note that this also holds for the previously discussed RFDAC based DTX concepts, including, Cartesian, multipolar, as well as results including Doherty, outphasing and supply modulation (efficiency enhancement techniques).

FIG. 2 shows a block diagram of a prior art hybrid direct digital RF/analog transmitter (see reference [6]) setup to target higher power levels that can be reached with conventional RFDAC based DTX techniques. An input baseband (I, Q) signal is first transformed in a polar signal transformer 11 providing an amplitude and phase signal ($\rho$, $\varphi$). A digital controller 12 transforms the amplitude signal to a digital amplitude code word (ACW) 12a, which is then input in parallel operating AND gates 14 in addition to a phase-controlled output of a local oscillator (LO) 13. The combined outputs of the parallel AND gates 14 provide an analog signal representation 15 from this digital transmitter setup, which is then fed to drive an analog amplifier output stage 16, which can be implemented in a high-voltage output stage technology such as gallium nitride (GaN) or laterally-diffused metal-oxide-semiconductor (LDMOS) to generate the aimed power level.

The use of an analog drive signal 15 for the power output stage 16 complicates the use of true switch-mode operation for this output stage. Note that the transition from linear analog operation to the saturated switch-mode operation is a very non-linear one, which puts high demand on the digital pre-distortion applied. The use of an analog interface makes the analog output stage 16 also sensitive for oscillation, which will yield compromises in its design in favour of guaranteeing stability for the output stage 16. In addition, the use of an analog interface also introduces bandwidth limitations and power scaling issues, due to very low input impedance levels in common-gate operation for a power device, which makes it very sensitive for interconnect parasitics. Or when applying a common-source FET output stage 16, the need for (analog) input impedance matching arises, which is difficult to achieve over a large bandwidth at higher power levels. Finally, the use of an analog output stage 16 still demands the use of quiescent current to linearize the AM-AM and AM-PM behaviour of the analog output stage 16 to acceptable levels. The later aspect also lowers the achievable efficiency in power back-off operation, or in low-traffic scenarios. Consequently, these hybrid implementations do not fully benefit from the potential advantages of true DTX operation.

In other solution attempts, aiming for higher transmit powers, digital driver(s) are used that generate a digital output signal to drive a high-voltage GaN or LDMOS output stage(s) (see e.g. [5]). Since in these configurations the output stages are in digital operation and are fully switched at all times, additional measures are required to set and control their level of generated RF output power. E.g. in outphasing transmitters the RF output power is controlled by a phase difference between two TX paths. As the digital drivers switch on and off the complete output stage(s) at each RF cycle, even in power back-off operation, the high-speed driver power consumption stays always the same what significantly lowers the achievable system efficiency in these power back-off conditions, or at low traffic scenarios. A similar conclusion holds when considering supply modulation concepts like envelope elimination restoration (EER) that use also switch-mode operation in their output stage.

It is noted that embodiments of the present invention can implement high performance, high power (e.g. with peak powers above 5 W), high resolution with a high number of effective bits, digital RFDAC-like transmitters (DTX). In view of this, it is also important to understand that prior art RF LDMOS/GaN technologies are all optimized for analog RF power amplifier applications, while CMOS technologies are mostly optimized for digital low-voltage high-speed operations.

In the embodiments of the present invention, an RF transmitter is provided that comprises a gate-segmented power output stage. This output stage comprises a field-effect transistor having a plurality of gate fingers and a plurality of drain fingers that define a gate periphery, the field-effect transistor comprising a plurality of power output stage segments that each correspond to a respective part of the gate periphery and that each have a respective power output stage segment input. Furthermore, the RF transmitter comprises a digital driver having control outputs which are connected to corresponding ones of the respective power output stage segment inputs, the digital driver being configured for individually switching each of the power output stage segments between an on-mode and a cut-off mode in dependence of one or more input signals to obtain a modulated RF carrier signal at an output of the gate-segmented power output stage.

Segmentation of the power output stage, i.e. using a gate-segmented power output stage transistor is applied, rather than using separate transistors as is done in all prior-art low-power RFDACs that are entirely implemented in a single CMOS or SOI technology. This innovative approach will result in much lower parasitics and consequently a much better RF performance at higher power levels for the RF transmitter. This can be implemented by dividing the original gate periphery of a power transistor into smaller pieces, yielding isolated power output stage segments 2, each with its individual connection to the digital driver. The gate periphery can be divided by grouping one or more gate fingers 32 into gate segments 3a, wherein each power output stage segment 2 corresponds to one or more segments. Furthermore, compared to an unsegmented power transistor, the gate fingers of the unsegmented power transistor may be divided into different pieces. Each such piece forms a gate finger 32 for the segmented power transistor.

Note that it is advantageous to implement this when the drain and/or source fingers are still continuous, i.e. shared among the individual devices implementing each power output stage segment 3. The drain fingers are e.g. connected at the output terminal 7 in parallel to each other, while the source is grounded directly by a highly doped sinker or plug that extends through the optionally thinned substrate. For example, the drain fingers 31 are connected using a drain bar 33 from which they all extend, preferably in parallel. This approach yields very low additional parasitics compared to using individual small standard LDMOS transistors. In GaN implementations many vias are used to ground the source, but also here the source and drain fingers can be made best continuous. Additional shielding of the drain from the metal structures connecting the gate elements is advantageous (e.g. by adding metal shields) to reduce the Miller capacitance between the drain finger and gate connection.

FIG. 3 shows a block diagram of an embodiment of a polar RF transmitter 1 according to the present invention. Similar to the exemplary transmitter blocks of the FIG. 2 prior art example, the RF transmitter 1 receives an input baseband (I, Q) signal which is first transformed in a polar signal transformer 11 providing an amplitude and phase signal ($\rho$, $\varphi$). A digital controller 12 transforms the amplitude signal to a digital amplitude code word (ACW) 12a, which is then input in parallel operating AND gates 14 in addition to a phase-controlled signal of local oscillator (LO) 13. However, in this case, the output 6 of each AND gate 14 is directly input to an associated power output stage segment input 4, i.e. (digital) RF driver output connections 10 are provided between digital driver 5 and gate-segmented power output stage 2. The plurality of AND gates 14 and further elements 11-13 form the digital driver 5, and the plurality of power output stage segments 3 form the gate-segmented power output stage 2 providing the output signal at output terminal 7. As indicated, the drains of the transistors of power output stage elements 3 are electrically connected, for example using a drain bar as described above. The connection between such a drain bar and the output terminal 7 can be for example be realized using bond wires.

It is noted that International patent publication WO2011/119315 discloses a digital-to-analog converter (DAC) having a DAC core section and a power amplifier section. In some embodiments various parts of both the DAC core section and the power amplifier section are implemented in different technologies (CMOS and III-V-semiconductor technology). The characterising features of the embodiments of the present invention, wherein a digital driver 5 is combined with a gate-segmented power output stage 2 is however not disclosed nor suggested in this publication.

Until now, there was very limited RF base station RF power market demand for the solution provided by the present invention embodiments, since the currently used 4G macro cell base-stations (with peak RF output powers up to several hundred watt), do not dramatically benefit from higher integration and digitalization. This is caused by the fact that output high-power stages in their analog power amplifiers dominate the overall TX system efficiency, while there are only a few TX line-ups in such a base station (3 to 6). This situation is drastically changed for 5G mMIMO base stations, which will have up to 64 to even 256 TX line-ups, far more than these previous 4G macro cell base stations. The high number of TX line-ups results in a much lower required output power per TX line-up. As a consequence, the overall power consumption of the total TX line-up, rather that the output stage alone, has become much more important. In addition, the integration of the TX line-up has become much more important for obvious cost reasons. Both facts motivated a search for new digital transmitter (DTX) solutions.

In prior art systems, switch-mode operation using (unsegmented) power output stages at RF frequencies at large power output levels always proved to be cumbersome. When aiming for high powers, large output stage transistors are required, which have relative large input and output capacitances. In conventional analog transmitter implementations these large capacitances of the output stage are resonated out, or absorbed within their input and output matching networks. However, when considering digital switch-mode operation, using a large (unsegmented) power device, the related large input capacitance needs to be charged and discharged every RF cycle by the preceding high-speed digital driver. This proves to be a challenging task in practical situations, due to the always present parasitic series inductances between the high-speed driver and the large input capacitance of those power devices, which effectively forms a low-pass filter with related bandwidth restrictions. Furthermore, the use of energy-efficient switch-mode operation, e.g. (inv.) class-E or (inv.) class-F, demands the harmonic output matching networks to absorb the output capacitance. This is increasingly more difficult at RF frequencies for larger values of the device output capacitance. Consequently, up to now, switch-mode operation for the output stage in base stations has never become popular at higher output powers or RF frequencies. All the considerations above lead to the situation of today, i.e. that the RF base station RF power market still stands on its own, and the preferred operating mode of the RF output stages is analog (class-B) oriented.

The much smaller individual power output stage segments 3, with related much smaller input capacitances, are less restricted in operating frequency. Depending on the digital baseband data and RF carrier, these segments are also switched between an on-mode and a cut-off mode, i.e. in a digital on/off manner, by the RF driver output connections 10. In an embodiment, the on-mode of a power output stage segment 3 comprises a saturation state of the power output stage segment 3. The saturation state in this context is e.g. a maximum current handling condition of the associated power output stage segment 3, or alternatively formulated, the gate-segmented power output stage 2 is operated in a current-limited operation mode for the associated output stage segments 3. Doing so, for the resulting RF transmitter 1 excellent code word-to-output signal linearity can then be achieved. When using the well-known saturation mode for output stage FET, it is important in this configuration that the "on" level of the individual RF driver output connections 10 always reaches the same voltage level over time. Use of the current limited operation of the (LDMOS/GaN) power output stage segment 3 when it is fully switched on (overdriven at its input) is advantageous, as this will lower the sensitivity on the actual output voltage of the digital driver in its "high" condition. For such embodiment, the controlling input voltage swing may be enlarged, or the $V_T$ of the FET used for implementing the gate-segmented power output stage 2 can be drastically lowered, such that the FET enters current-limited mode of operation even with low driver voltage swings. This can be done by making the gate oxide thinner and engineering the doping profiles of the FET.

In a further group of embodiments, the digital driver 5 and gate-segmented power output stage 2 are implemented in different semiconductor technologies. In the exemplary embodiment shown in FIG. 3 e.g. the entire digital driver 5 part can be implemented in a different semiconductor technology than the plurality of power output stage segments 3 forming the gate-segmented power output stage 2. This allows using semiconductor technologies that are optimized for that specific part of the RF transmitter 1. E.g. the digital driver 5 comprises a CMOS digital driver, i.e. the digital driver 5 is provided in high-speed CMOS technology, enabling to provide associated signals on the RF driver output connections 10. In a further embodiment, the gate-segmented power output stage 2 comprises transistors of the laterally diffused metal-oxide-semiconductor (LDMOS) transistor type, and/or a GaN-based field-effect transistor type, allowing a high power output by the RF transmitter 1. Note that further III-V semiconductor technology may be used. Additionally, or alternatively, other $V_T$-shifted technology allowing the transistor(s) of the power output stage elements to be driven by the signals on the high speed RF driver output connections 10 may be used.

The transistors of the gate-segmented power output stage 2 can be configured to have a threshold voltage for allowing the digital driver 5 to individually switch each of the power output stage segments 3 between an on-mode and a cut-off mode in dependence of the control outputs 6. Note that various options are available to obtain the needed $V_T$-shift for the power device, which as such are known to the person skilled in the art (e.g. using a different channel doping or thinner gate oxide).

As an alternative implementation, the RF transmitter 1 further comprises a plurality of level shifters connected in between the control outputs 6 of the digital driver 5 and the power output stage segment inputs 4 of the gate-segmented power output stage 2. These level shifters are particularly useful when driving a GaN implemented segmented power device. A person skilled in the art can implement such level shifters as part of the driver part 5 or as part of the gate-segmented power output stage 2.

The digital driver 5 can be provided in a first semiconductor die 8, and the gate-segmented power output stage 2 can be provided in a second semiconductor die 9, the first semiconductor die 8 being different from the second semiconductor die 9. The digital driver 5 may comprise a plurality of output terminals 8a associated with the control outputs 6, and the gate-segmented power output stage 2 may comprise a plurality of input terminals 9a associated with each power output stage segment input 4. The RF transmitter may further comprise connections 10 between respective output terminals 8a on the first semiconductor die 8 and associated input terminals 9a on the second semiconductor die 9.

Figure 4:
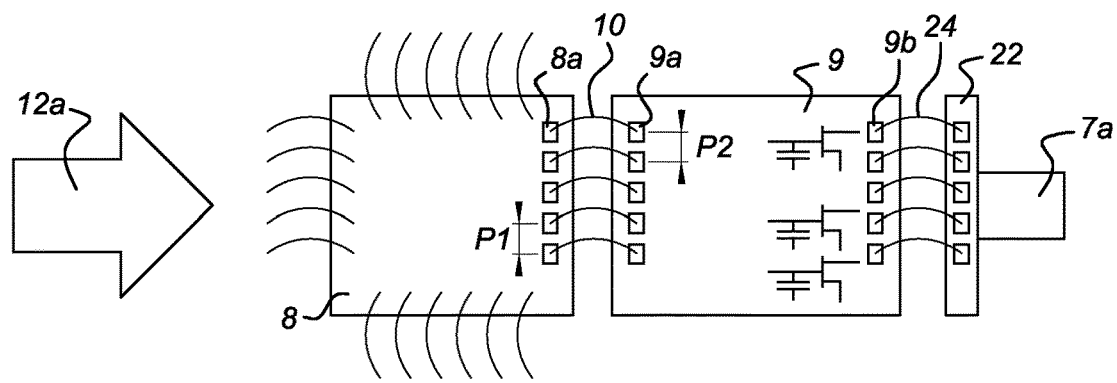
FIG. 4 shows a conceptual view of a further embodiment of a power RF transmitter according to the present invention.

FIG. 4 shows a conceptual view of a further embodiment of the RF transmitter 1 of the present invention, showing a part of the RF transmitter 1 architecture, using a gate-segmented power output stage 2 configured for edge coupling. Shown is an input (in this embodiment as a digital serial bus 12a input) which is connected to a first semiconductor die 8, implementing (part of) the digital driver 5 as discussed above. Output terminal 8a on the first semiconductor die 8 is connected to input terminals 9a on the second semiconductor die 9 by connections 10. A transmitter output terminal 7a in connection with a combiner terminal 22 is connected to segment output terminals 9b via connections 24. Typically, output terminals 9b are grouped in a drain bar. As indicated, the first semiconductor die 8 is implemented as CMOS or silicon-on-insulator (SOI) technology, and the second semiconductor die 9 as LDMOS or GaN technology. To allow the connections 10 to be made, the output terminals 8a on the first semiconductor die 8 and the input terminals 9a on the second semiconductor die 9 are provided in an edge part of the first semiconductor die 8 and the second semiconductor die 9, respectively. In this implementation, all output terminals 8a associated with the control outputs 6 are preferably located on the edge of the first semiconductor (CMOS) die 8, and the input terminals 9a associated with the power output stage segment inputs 4 are on the edge of the second semiconductor (LDMOS) die 9. Fine pitch staggered bond wires may be used to connect the dies 8, 9. Note that the bond wires may be specifically oriented in order to minimize inductive coupling. For example, the connecting bond wires 10 can be kept short (e.g. below 0.7 mm) and/or alternating bond wire shapes can be used. The shape of the bond wires 10 can be made alternating to lower the mutual coupling that gives rise to bit-bit interactions.

As shown in the exemplary embodiment of FIG. 4, a pitch distance $p_1$ between the output terminals 8a on the first semiconductor die 8 is substantially equal to a pitch distance $p_2$ between the input terminals 9a on the second semiconductor die 9, allowing to make a significant number of direct connections between associated output terminals 8a and input terminals 9a. Note that a high number of connections allows using more output stage segments, which is beneficial for the linearity and will lower the quantisation noise.

In addition, ground connections may be provided between the first semiconductor die 8 (or digital driver 5) and the second semiconductor die 9 (gate-segmented power output stage 2/power output stage segments 3), as part of or in addition to the connections 10. This will avoid unpredictable ground path inductances between the digital driver 5 and the power output stage segments 3, which otherwise could result in timing and voltage level differences when driving the various power output stage segments 3.

Figure 5:
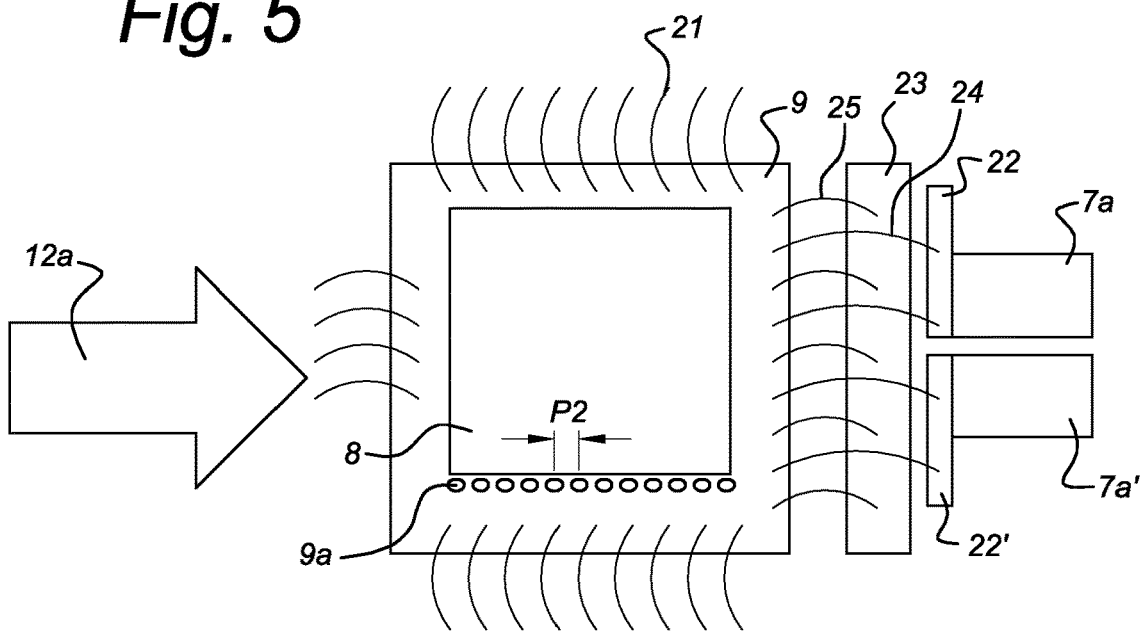
FIG. 5 shows a conceptual view of an even further embodiment of an RF transmitter of the present invention.

As an alternative, the connections 10 may comprise fine pitch interconnect film connections (as for example can be found in reference [7]), or the connections 10 may comprise flip-chip type connections. This allows a configuration of the RF transmitter 1 with a CMOS or SOI semiconductor (controller/driver) die 8 on top of a LDMOS or GaN semiconductor die 9, as shown in the embodiment of FIG. 5, showing a conceptual view of an even further embodiment of the RF transmitter 1 of the present invention. This particular embodiment example has two output terminals 7a, 7a' (and corresponding power combiner terminals 22, 22', via connections 24), e.g. to implement a dual TX line-up structure of the RF transmitter 1 (e.g. with two separate gate-segmented power output stages 2). Such a hardware configuration could be used to implement e.g. a push-pull, a two-way Doherty, outphasing, or dual RF carrier TX configuration, e.g. to improve respectively in wideband performance, power back-off efficiency, or multiband operation. Using a flip-chip connection, many more signal ground connections between the digital driver 5 and the gate-segmented power output stage segments 3 are possible. This will also make the signal paths as short as possible and very well defined. Using a fine pitch (see the pitch $p_2$ shown in FIG. 5) the number of interconnects 10 can be made really large, allowing (but not necessarily restricted to) the use of segmented output stages 2 with thermometer bits only. It is advantageous in such a thermometer approach that conventional ESD protection (usually in the form of diodes near the output terminals 8a/input terminals 9a) is circumvented or drastically reduced. This will avoid too much capacitive loading of the digital driver 5 which would yield increased power consumption of the digital driver 5. In other words, the output terminals 8a and input terminals 9a are directly connected to the control outputs 6 and power output stage segment inputs 4, respectively, i.e. without normally present ESD protection circuitry.

In an even further embodiment, the RF transmitter 1 further comprises external terminals 21 provided on the second semiconductor die 9. Where necessary, one or more of these external terminals 21 are routed to the first semiconductor die 8 via the second semiconductor die 9, i.e. all external connections of the RF transmitter 1 are provided on the second semiconductor die 9.

In the embodiment shown in FIG. 5, the RF transmitter further comprises a grounded MOS capacitor component 23, connected to the second semiconductor die 9 via connections 25. This embodiment uses a gate-segmented power output stage 2 configured for flip-chip interconnect. The inductance formed by bond wires 25 can be used to resonate out the output capacitance of the segmented power device at or close to the operational frequency of the RF transmitter 1.

FIG. 6 shows a top view of an embodiment of a gate-segmented power output stage 2 as useable in embodiments of the present invention, specifically for an embodiment having two dies 8, 9 with bond wires as connections 10. The specific example of the second semiconductor die 9 shows a gate-segmented power device intended for edge connection using thermometer weighted elements only. In this example configuration each drain finger 31 of the gate-segmented power output stage 2 is embedded between two gate fingers 32 that can be each individually controlled as independent gate segment 3a. Moreover, each power output stage element 3 comprises a single respective gate segment 3a. All drain fingers 31 are connected to a drain bond bar 33 which is used to connect to an (external) matching network or power combiner. In order to obtain a compact power device layout with a sufficient number of thermometer bits, a high density edge connection with a fine pitch for the interconnect is required. Besides the gate bond pads 34 also bond pads 35 for the ground are provided in order to provide a well-defined return path for the driver current. Note that the ground bond pads 35 can be hard grounded using through-wafer vias (e.g. in GaN technology) or using highly doped through-wafer plugs as available in LDMOS technology. To achieve the highest signal quality of the digital transmitter it is beneficial to have as many thermometer weighted gate segments 3a/power output stage elements 3 as possible and to activate the gate segments 3a/power output stage elements 3 in a monotonic sequence e.g. from left to right as indicated in the FIG. 6 (arrow 36), or vise-versa from right to left. As a refinement on the use of pure thermometer weighted gate segments, one could consider the use on non-linear sizing of these segments e.g. by making the gate width of segments that are activated only at the higher amplitudes somewhat larger to compensate for the compression phenomena of the overall segmented power stage at these larger drive levels. This reduces the burden for linearization and may result in a less complex DPD or may even allow DPD free operation.

To further increase the output signal quality and lower the effective quantization noise of the proposed digital TX implementation, up-sampling, interpolation, as well as, dithering techniques can be applied. Especially, dithering based techniques proved to be very effective in the proposed TX architecture, when applied on the latest activated (thermometer) element 3a in the thermometer controlled device. By toggling this element between its on and off state in a smart manner (e.g. by using delta-sigma or pulse-density modulation), with a toggling rate that is significantly higher than the actual video bandwidth of the TX signal, on average, effectively intermediate levels in the otherwise quantized digital TX output signal can be added, which directly lowers the effective TX output quantization noise. This allows to further enhance the dynamic range of the RF transmitter 1, the digital driver 5 is arranged to implement dithering of one or more bits of the gate-segmented power output stage 2 in a further embodiment.

In addition to the segmented power device fingers (i.e. gate segments 3a), an extra shielded connection 37 (with overlying shielding 39) can be provided to pass the output signal from the drain bond bar 33 back to the controller side such that it can be monitored for its quality (through metal bond pad 38). This is very useful when also implementing a digital pre-distortion function on the digital controller chip. Doing so will provide a much higher system integration at minimal cost, compared to the current state-of-the art solutions. Note that the extra shielding 39 is needed to preserve the signal quality of the monitored output signal in this electronically harsh environment.

Figure 7B:
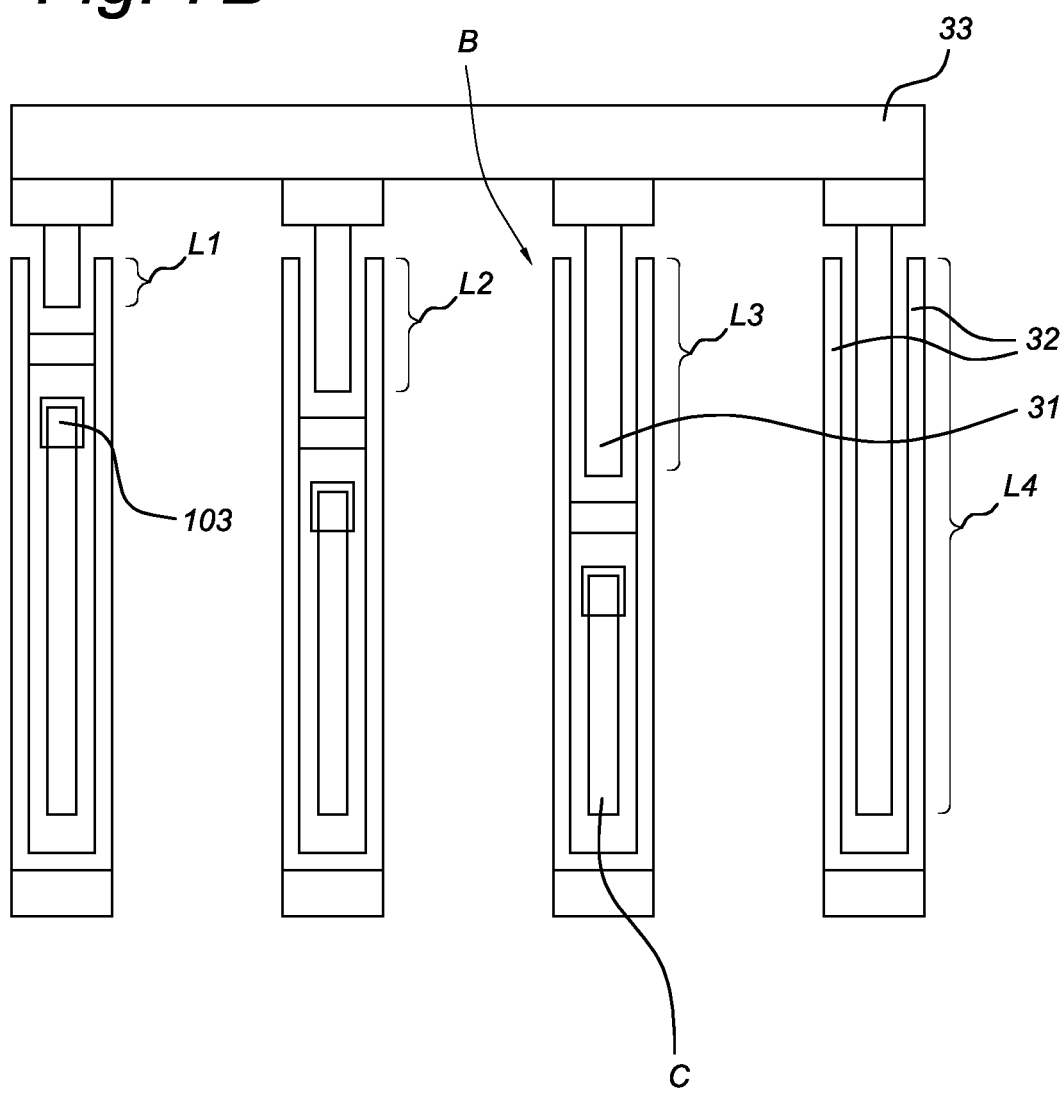
FIG. 7A shows a top view of an embodiment of a LDMOS die with two edge-connected gate-segmented power output stages in accordance with the present invention, and FIG. 7B show a corresponding detailed view.

FIG. 7A shows a top view of an embodiment of a gate-segmented power output stage 2 as useable in embodiments of the present invention, specifically for an embodiment having two dies 8, 9 with bond wires as connections 10. FIG. 7B shows a corresponding schematic detailed view. The specific example of the second semiconductor die 9 shown has two banks (one indicated by D) of gate segments 3a/power output stage elements 3, implemented in LDMOS semiconductor technology. The configuration that is shown here uses per drain finger 31 only one control connection 34 that drives both the left and right gate finger 32 as such acting as one gate segment. In this example each bank features fifteen thermometer bits and seven binary weighted bits, the latter shown in more detail in FIG. 7B. Note that in contrast with the embodiment in FIG. 6 the gate fingers 32 left and right of a drain finger 31 share the same driver connection 34 connected to input terminal 9a. In the example built, the digital driver 5 was implemented in CMOS technology using thick-oxide transistors, facilitating a maximum output voltage swing of e.g. 2.5 V. A downwards $V_T$-shift has been used in the implementation of the power output stage segments 3 on the second semiconductor (LDMOS) die 9 to make them compatible with the voltage-swing of their associated CMOS drivers. In such a configuration implemented using two separate dies 8, 9, both dies 8, 9 require ESD protection, leading to extra parasitic interconnect capacitance at each side. In this example, the input capacitance of a single power output stage segment 3 is 1.1 pF. Per interconnect a total of 1.3 pF needs to be attributed to ESD protection diodes. The CMOS 2.5 V thick-oxide output drivers are dimensioned for maximum system efficiency. Further increasing their size yields faster rise and fall times, enhancing the LDMOS drain efficiency, but at the cost of increased driver capacitances and driver power dissipation, which eventually degrades the overall efficiency of RF transmitter 1. Future implementations might feature power devices with an even lower $V_T$, such that thin-oxide very high-speed devices (voltage swing ~1.1V) can be used to drive them, extending the operation frequency range even more. To reduce the impact of these capacitances, a practical RF transmitter 1 architecture limits its number of connections 10, favouring binary-weighted output-stage devices. Nevertheless, for linearity reasons, thermometer coding is considered more advantageous.

In the proposed dual RF transmitter 1 line-up demonstrator shown in FIG. 7A, two different coding techniques are used, namely binary coding and thermometer coding. For the most significant bits (MSBs), thermometer coding is used, whereas for the least significant bits (LSBs), binary coding is used. More in particular, in the FIG. 7A embodiment, a total LDMOS gate width ($W_{gtot}$) of 41.5 mm has been segmented into two banks, each bank having 15 thermometer-coded most significant bits (MSBs) (one indicated by A and the combination of MSBs denoted by 100) and 7 binary-weighted least significant bits (LSBs) (one indicated by B and the combination of LSBs denoted by 101). In this implementation, the lowest LSBs (in the middle and denoted by 102) have been implemented twice to create some redundancy.

The power outputted by one bank of gate-segmented power output stage 2 can be computed using Wm×P1+Wn×

$2^{-n} \times P1$, wherein Wm (m=1 ... 15) represents the weight factor for the mth power output stage element 3/gate element 3a that corresponds to the thermometer code, Wn (n=1 ... 7) represents the weight factor for the nth power output stage element 3/gate element 3a that corresponds to the binary code, and P1 the power outputted by a power output stage element 3/gate element 3a corresponding to the thermometer coding. The factor $2^{-n}$ describes how the gate finger width of a power output stage element 3/gate element 3a corresponding to binary coding should be chosen with respect to the gate finger width of a power output stage element 3/gate element 3a corresponding to thermometer coding. Moreover, weight factors Wm and Wn can typically either be 0, corresponding to the cut-off mode, or 1, corresponding to the on-mode.

The 15 power output stage elements 3/gate elements 3a corresponding to the thermometer coding allow 16 different values to be generated, whereas the 7 power output stage elements 3/gate elements 3a corresponding to the binary coding allow 128 different values to be generated. Hence, in total 128×16=2048 different values can be generated, which corresponds to a binary word of 11 bits.

For the binary-weighted bits, the drain is cut into two mutually isolated parts. A first part, indicated by L1-L4, indicates the part of the drain finger that cooperates with gate fingers 32 for the purpose of generating signals. The other part, which lies in line with the first part, is connected to ground, for example using a via 103. The use of these shorted drain lines equalizes the input (gate) capacitances of all segments.

For the $n^{th}$ LSB, the effective LDMOS gate width is $2^{-n}$ times that of a thermometer MSB. For example, in FIG. 7B, L4 defines the effective gate width of the gate fingers corresponding to the thermometer coding. Moreover, L4=2× L3=4×L2=8×L1.

In terms of linearity, thermometer coding is preferred as the binary coding scheme requires considerable switching of RF currents in view of the large amount of changes between sequential numbers. For example, changing between binary code 0111 and 1000 involves changing 4 bits. However, compared to binary coding, thermometer coding requires a large number of power output stage elements. The Applicant has found that combining thermometer coding for the MSBs and binary coding for the LSBs yields excellent results despite the limited number of inputs.

Furthermore, it is noted that the two resulting identical RF transmitter 1 line-ups of the realized demonstrator can operate fully independently of each other, allowing various TX-operation modes, such as, but not limited to, polar, (multi-phase) Cartesian, single-ended, push-pull, Doherty and outphasing.

The example shown in FIG. 7A has a number of features. For example, at least a part of the power output stage segments 3 has similar transistor dimensions, and the digital driver 5 comprises a thermometer bit style interface to the gate-segmented power output stage 2. This has the advantage of avoiding time alignment problems with the drivers with their unavoidable inductive interconnects (e.g. connecting bond wires 10), since all the (capacitive) loading of each digital driver can be kept identical. In a thermometer bit style interface all power output stage segments 3 may have the same size and related loading capacitance. In embodiments in which not all power output stage segments 3 have the same size, extra loading capacitances can be added to the smaller binary bits, to equal the total capacitance of the thermometer bits. This can be implemented as discussed above in conjunction with the binary coding. It is noted that this binary coding can be optional.

With respect to the example in FIG. 4 and the implementation example shown in FIG. 6, further observations can be made. These implementations use a segmentation that is particularly applicable in an edge-connected configuration of the digital driver 5 and the power output stage segments 3 (e.g. as given in FIG. 4). Alternatively, several in-line gate fingers 32 can be used in combination with a single drain finger 31, as is depicted in the top view shown in FIG. 8. Compared with an unsegmented transistor, it can be observed that the gate fingers of the unsegmented transistor have been segmented into a plurality of gate fingers 32. These gate fingers 32 are arranged in a pattern of parallel rows. Each row extends in parallel to the drain fingers 31 and comprises a plurality of gate fingers 32. This configuration is most applicable to flip-chip approaches as discussed above with reference to FIG. 5 as more segments can be used when compared to the edge-connection of FIG. 7A.

Figure 8:
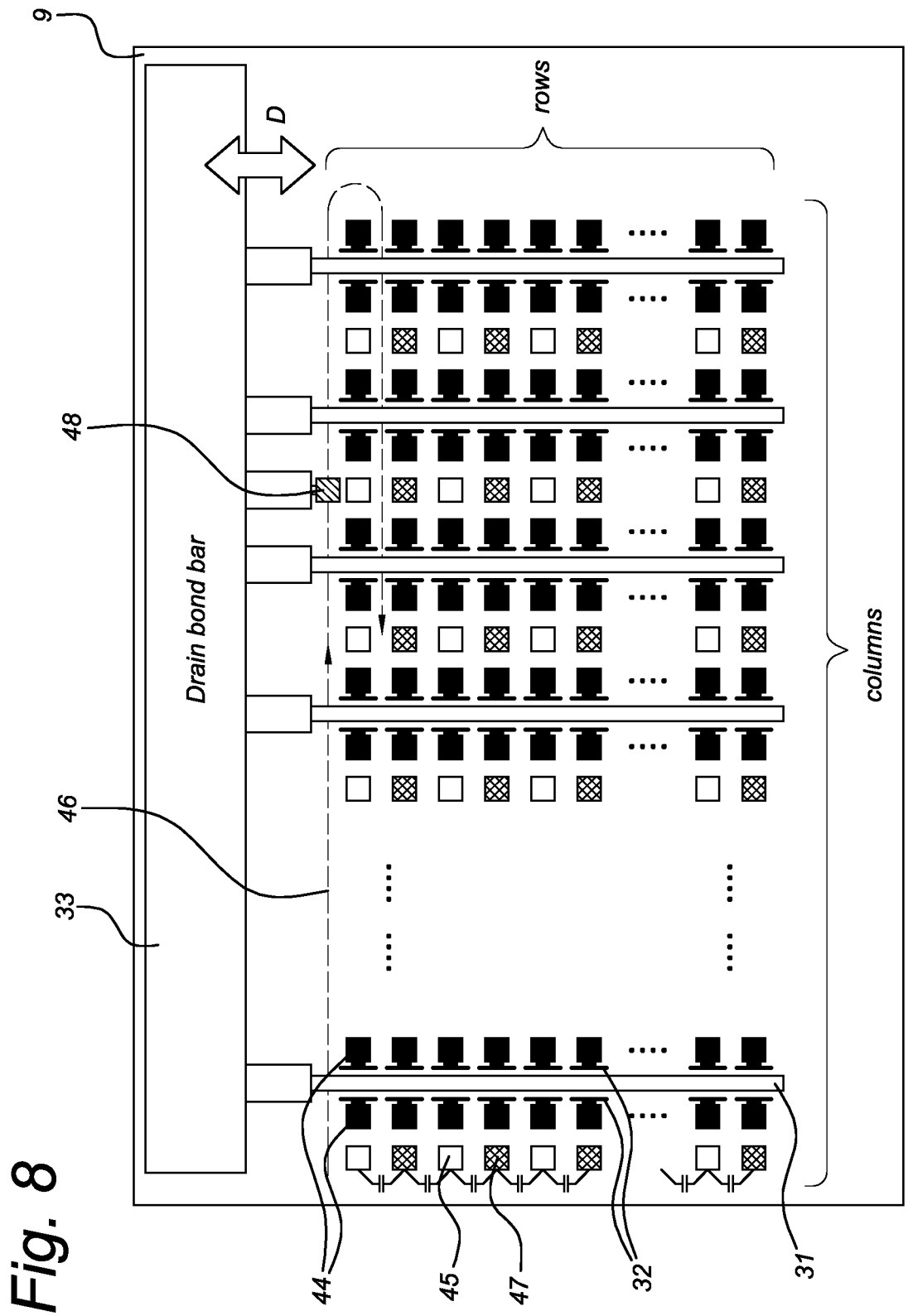
FIG. 8 shows a top view of an embodiment of a gate-segmented power output stage, implemented in an LDMOS power die and arranged to be flip-chip connected, in accordance with the present invention.

In the configuration example of FIG. 8, the output stage drain fingers 31 are embedded between two source contacts 45 while being surrounded by gate fingers 32 that are electrically isolated from each other. Each gate finger 32 has a flip-chip gate bump connection 44 to the CMOS digital driver 5 on the first semiconductor die 8 which is placed on top of the second semiconductor die 9. Additional shielding plates between the drain—gate connected structures (bond pads) may be placed to lower the impact of Miller like capacitances. Due to the small dimensions of the flip-chip connections 10, both the capacitive as well as inductive interconnect parasitics per segment are minimized, allowing higher RF operating frequencies, finer segmentation, and lower bit-to-bit interaction yielding better linearity. If ESD diodes can be avoided, the capacitive loading per control output 6 of digital driver 5 is drastically reduced. This combined with the fact that the individual power output stage segments 3 can be made much smaller, while still having a comparable total gate width for the entire gate-segmented power output stage 2, helps in reaching higher operating frequencies.

Since the loading capacitances per power output stage segment 3 in this case are much smaller, tapered buffers on the CMOS digital driver 5 can have less stages. This is especially true if the use of ESD diodes can be avoided or minimized) Shorter tapered buffers yield less delay variation with the driver supply voltage. This is beneficial in achieving a better quality of the spectrum of the output signal 7.

In RF power LDMOS technologies, the (continuous) sources of an output stage are hard grounded by a highly-doped through-substrate plug, as well as, the use of a thinned substrate (typically ~50 um). Consequently, by using extra (source/ground) connections in the LDMOS die, better supply decoupling of the CMOS digital driver 5 components 14 can be achieved, yielding lower supply induced variations in the output voltage on the driver control outputs 6, improving the quality of the output spectrum of the overall digital RF transmitter 1. By using in addition, high density capacitors on the power die 9 as shown in FIG. 8, in combination with additional supply contacts 47 (indicated with a V) for the driver, this can be improved even further.

In FIG. 8, gate fingers 32 are positioned in line. More in particular, the gate fingers 32 directly on top of the gate oxide, are in line. Each row of in-line gate fingers 32 is associated with a single continuous active area. In FIG. 8, each drain finger 31 corresponds to two adjacent active areas.

Various activation sequences are possible for the power output stage segments 3, allowing to obtain a close to monotonic ACW to RF-output signal transfer. In view of this a row by row activation gives the best performance (as indicated by arrow 46 in FIG. 8).

In an even further embodiment, output signal observation and control (e.g. in the form of an on-chip digital pre-distortion (DPD) component) can be added, as it is possible to directly connect to the output terminal 7a to monitor the quality of the output signal 7 (e.g. through a contact 48 in FIG. 8), down sample it and feed it to a DPD component that is arranged to correct for hardware imperfections. As such a fully integrated power digital RF transmitter 1 can be established within very small dimensions. Finally to allow bonding of the drain bond bar 33 for the output matching, some distance (D) between the flip-chipped controller chip 8 (overlying the gate bump connections 44 in the FIG. 8 embodiment) and the drain bond bar 33 will be needed.

Figure 9:
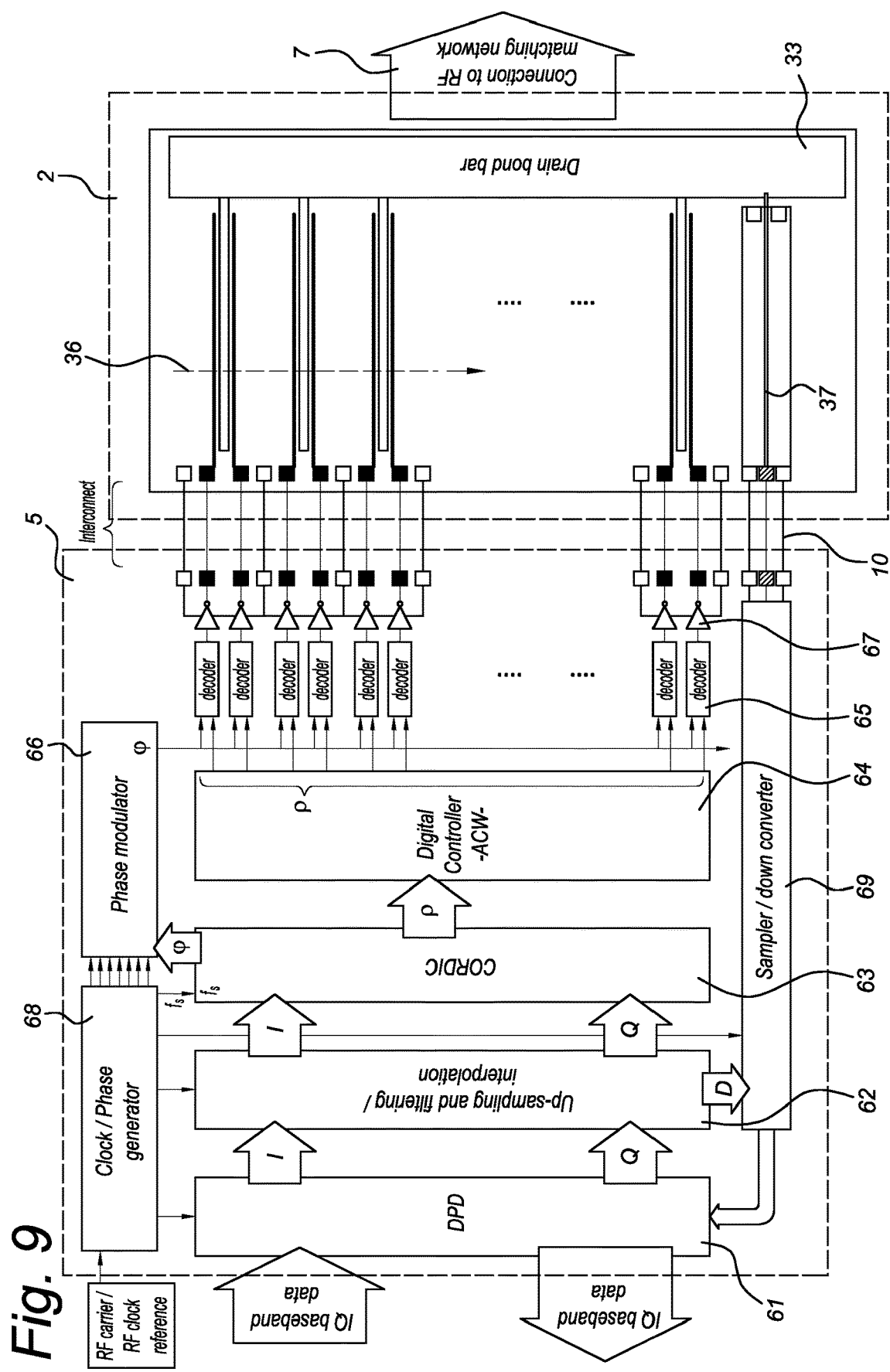
FIG. 9 shows a polar DTX configuration with gate-segmented power output stage featuring an output signal down-conversion path and DPD signal correction, usable in various embodiments of the present invention.

FIG. 9 shows a more detailed block diagram of an embodiment of a polar RF transmitter 1 using gate segmentation in the output stage in accordance with the invention featuring an optional feedback path and on-board digital pre-distortion (DPD), usable in embodiments of the present invention. The digital driver 5 of the RF transmitter 1 is e.g. implemented in a first semiconductor die 8, and the gate-segmented power output stage 2 in a second semiconductor die 9.

Similar to the exemplary transmitter blocks of the FIG. 1 and FIG. 2 prior art examples, the RF transmitter 1 receives an input baseband (I, Q) signal, which is pre-corrected by the DPD block 61. Next the corrected I and Q signal is up-sampled and filtered using interpolation in processing block 62. The resulting new I and Q data representation is transformed in a polar signal transformer (CORDIC) 63 providing the digital amplitude and phase representations ($\rho$, $\varphi$). A digital controller 64 transforms this amplitude to a digital amplitude code word (ACW) 12a, which is used as input for the in parallel operating decoders 65, (that in their simplest implementation can be implemented as logic AND gates 14, see FIG. 2) and combined with the polar phase-modulated clock signal provided by phase modulator 66. The output of the decoders 65 is fed to digital on-chip buffers 67 that are able to drive in a digital like fashion the plurality of individual power output stage segments 3.

The resulting output power of the gate-segmented power output stage 2 device is delivered to the output terminal 7 (e.g. connected to the drain bond bar 33 of the FIG. 6 embodiment of the second semiconductor die 9), which in turn is connected to a matching or power combiner network, which as such is known to the person skilled in the art.

To ensure a monotonic ACW-output power relation, the activation to the power output stage segments 3 is best done in a monotonic sequential manner as indicated by arrow 36 in FIG. 9 (see also FIG. 6). The polar phase used for the decoders 65 is originating from the external RF carrier or reference clock, which is used on-chip in the clock/phase generator 68 to create the various digital clocks for the different sub-blocks. By creating multiple phase shifted clocks in combination with the digital phase representation $\varphi$, a (low-power) Cartesian harmonic rejection RFDAC with output limiter concept (see reference [4], the relevant contents of which are incorporated herein by reference) can be used to implement the wideband phase-modulator 66 that provides the actual polar phase to the decoders 65. A fraction of the output signal present at the drain bar 33, is fed back through a shielded structure on the power die 9 via shielded metal connection 37 (and metal bond pads 38), to the CMOS/SOI implemented digital driver 5. After sampling/down conversion (in sampler/down converter block 69) this information is used to train the (on-chip) DPD 61, or (optionally) can be shared to an external DPD correction unit e.g. as baseband IQ data. This external DPD unit in turn would alter the incoming IQ baseband data stream of the controller-driver IC.

The conceptual visualisation in FIG. 9 of the interconnections 10 between the digital driver 5 and the gate-segmented power output stage 2 on the LDMOS/GaN device 9 is shown for an edge-coupled configuration similar to that of FIG. 6. Extra ground/source contacts 35 have been added to better define the current return paths and improve the bias decoupling of the digital buffers 67, both needed to lower AM-PM distortion of the digital power transmitter 1. The previously described concept can also be used for a flip-chip version (e.g. as shown in FIG. 5) using the segmentation as previously shown in FIG. 8. Note that the monitor connection (i.e. shielded metal connection 37) of the TX output signal in a flip-chip version can be done in a more direct way by a simple bump connection. Furthermore, when using a GaN gate-segmented output stage, a level shifter needs to be included in the buffer implementation, to adopt for the required negative potential of the GaN gate.

Figure 10:
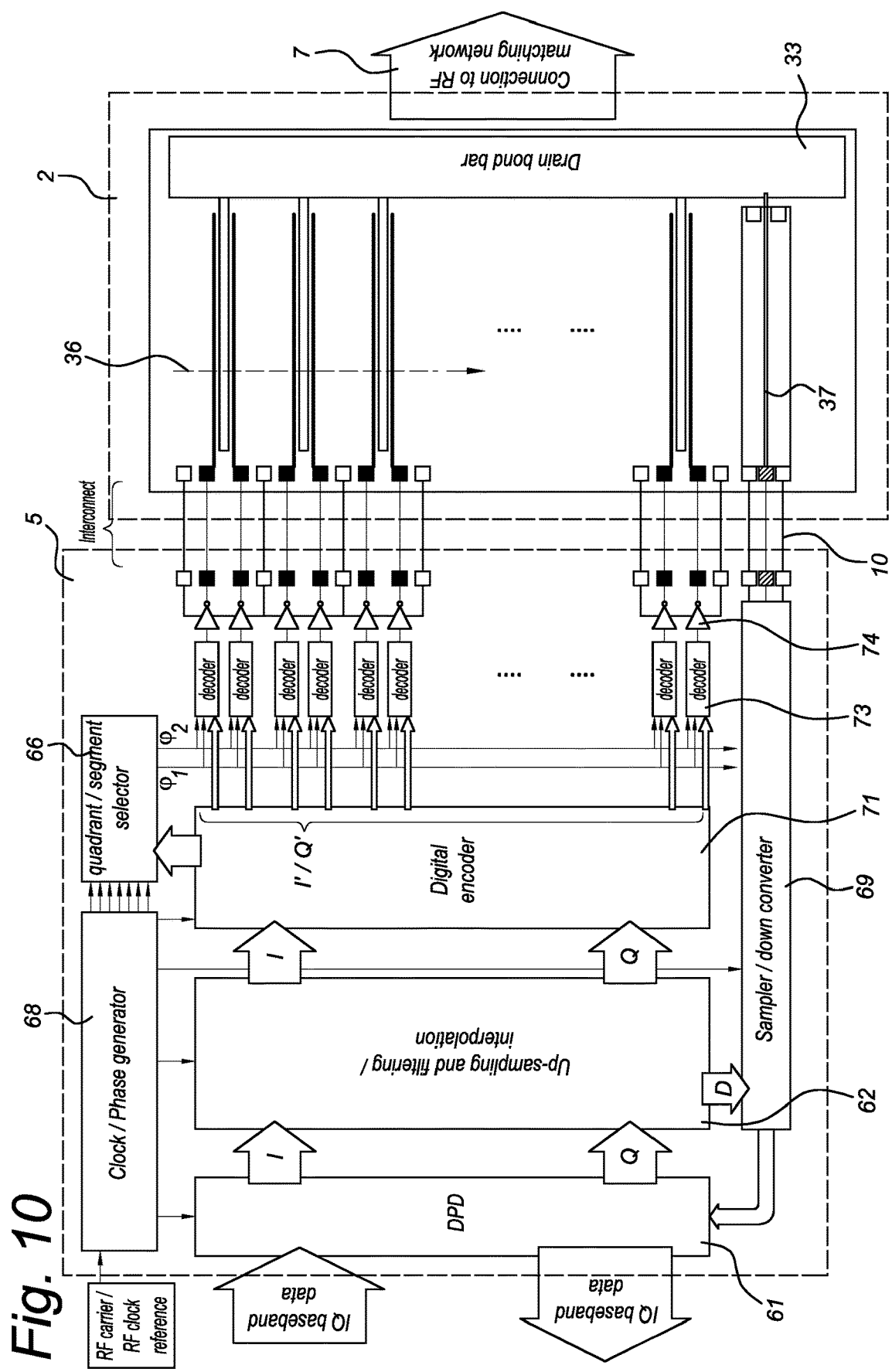
FIG. 10 shows a (multi-phase) Cartesian DTX configuration with a gate-segmented power output stage featuring an output signal down-conversion path and DPD signal correction, usable in various embodiments of the present invention.

FIG. 10 shows a more detailed block diagram of an embodiment of a (multi-phase) Cartesian RF transmitter 1 in accordance with the present invention using gate-segmentation in the output stage 2 featuring an optional feedback path 37 and on-board digital pre-distortion (DPD) 61. Similar to the previously described FIG. 9 embodiment and the exemplary transmitter blocks of the FIG. 1 and FIG. 2 prior art examples, the RF transmitter 1 receives an input baseband (I, Q) signal, which is pre-corrected by the DPD block 61. Next the corrected I and Q signal is up-sampled and filtered using interpolation in processing block 62. The resulting new I and Q data representation is fed to a digital encoder 71, which controls the quadrant/segment selector 72, which in turn provides/passes the actual vector phase $\varphi_1$ and $\varphi_2$ of the active quadrant/segment (see also reference [3], the relevant contents of which are incorporated herein by reference). The digital encoder 71 provides the interleaved amplitude I'Q' code word to the decoders 73, which combine it with the proper vector phases. The output of the decoders 73 are fed to digital on-chip buffers 74 that are able to drive in a digital like fashion the plurality of individual power output stage segments 3. The resulting (vector) summed output power of the gate-segmented power output stage 2 is delivered to the output terminal 7 (e.g. connected to the drain bond bar 33 of the FIG. 6 embodiment of the second semiconductor die 9), which in turn is connected to a matching or power combiner network, which as such is known to the person skilled in the art.

To ensure a monotonic ACW-output power relation the activation to the gate segments 3a is best done in an I'Q' interleaved sequential manner as indicated by arrow 36 in FIG. 10, yielding a sequential and monotonic activation of the power output stage segments 3. The vector phases used for the decoders 73 are originating from the external RF carrier or reference clock, which is used on-chip in the clock/phase generator 75 to create the various digital clocks for the different sub-blocks. By creating multiple phase-shifted clocks (e.g. eight as in reference [3]), the quadrant/segment selector 72 can select the proper/active vector phases, based on the control provided by the digital encoder 71 that makes its decision using the interpolated IQ data. A fraction of the output signal present at the drain bar 33, is fed back through a shielded structure on the power die 9 via shielded metal connection 37 (and metal bond pads 38), to the CMOS/SOI implemented digital driver 5. After sampling/down conversion (in sampler/down converter block 69) this information is used to train the (on-chip) DPD 61 or (optionally) can be shared to an external DPD correction unit (e.g. as baseband IQ data). This external DPD unit in turn would alter the incoming IQ baseband data stream of the controller-driver IC.

The conceptual visualisation in FIG. 10 of the interconnections 10 between the digital driver 5 and the gate-segmented power output stage 2 on the LDMOS/GaN device 9 is shown for an edge-coupled configuration. Extra ground/source contacts 35 have been added to better define the current return paths and improve the bias decoupling of the digital buffers 67, both needed to lower AM-PM distortion of the digital power transmitter 1. The previously described concept can also be used for a flip-chip version (e.g. as shown in FIG. 5) using a segmentation as previously shown in FIG. 8. Note that the monitor connection (i.e. shielded metal connection 37) of the TX output signal in a flip-chip version can be done in a more direct way by a simple bump connection. Furthermore, when using a GaN gate-segmented output stage, a level shifter needs to be included in the buffer implementation, to adopt for the required negative potential of the GaN gate.

Figure 11:
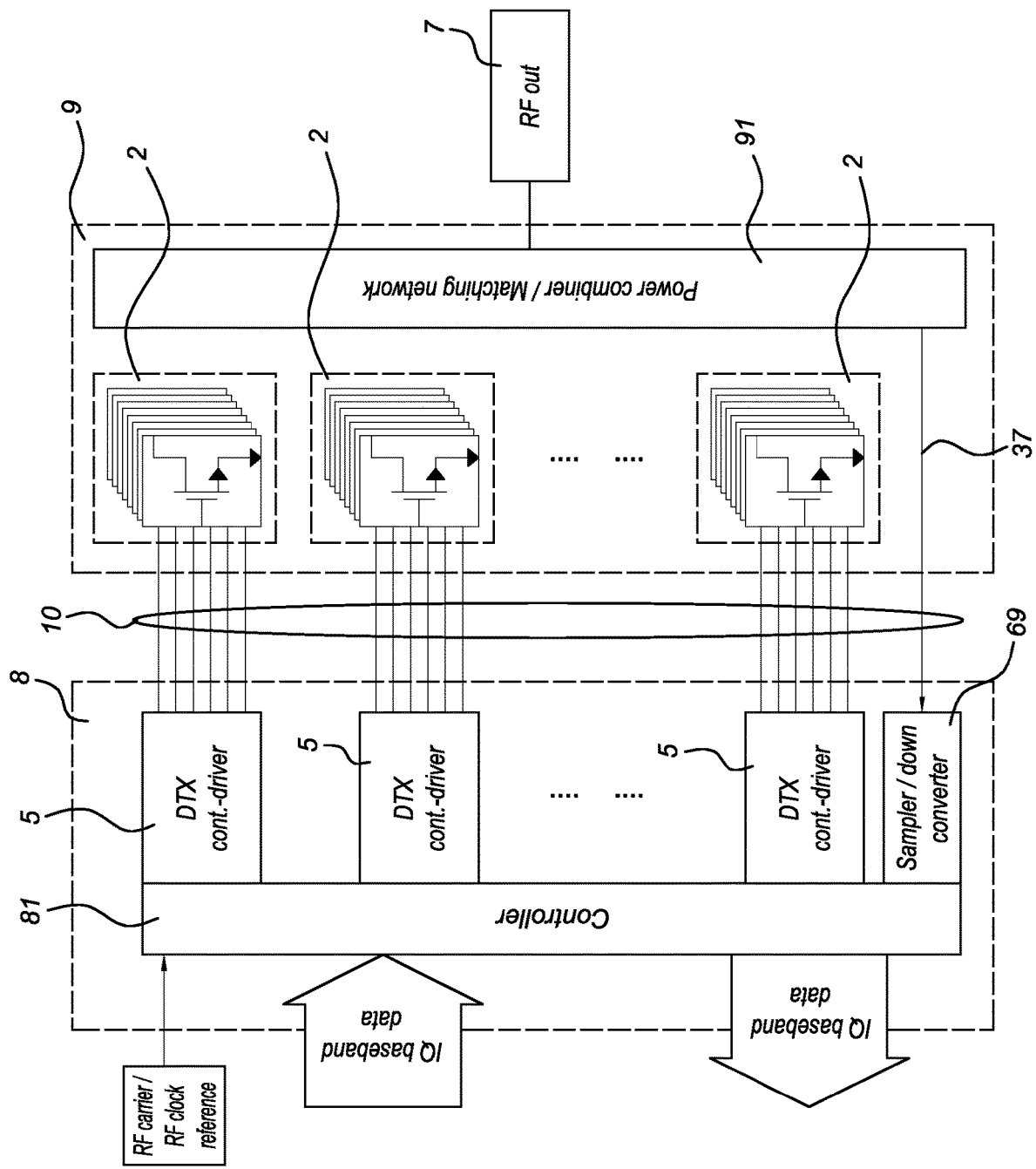
FIG. 11 shows a concept of a DTX featuring multiple segmented output stages configured as high efficiency transmitter (e.g. N-way Doherty or N-way outphasing transmitter), usable in various embodiments of the present invention.

FIG. 11 shows a high-level diagram of the previously described techniques in a more energy-efficiency embodiment of the proposed RF transmitter 1 using multiple gate-segmented power output stages 2 with an optional feedback path 37 and on-board digital pre-distortion (DPD), according to the present invention. Note that such a configuration can be used to implement a (N-way) Doherty (similar as is done for low powers in reference [4]) or (N-way) Outphasing digital RFDAC-like transmitter configuration, which provides improved efficiency in power back-off operation when working with complex modulated signals as is the case of base station applications.

Similar to the previously described FIG. 9 and the exemplary transmitter blocks of FIG. 1 and FIG. 2 prior-art examples, the overall RF transmitter receives an input baseband (I, Q) signal and an RF carrier/RF clock reference, which is fed to a digital controller 81 implemented in high-speed CMOS/SOI technology (first semiconductor die 8), that handles the activation and control of the various DTX drivers 5 with proper phase relations to control a plurality of gate-segmented power output stages 2 implemented on a LDMOS or GaN power die 9. These power output stages 2 are connected to a power combining network 91 (on or off-chip) which provides the transmitter signal to output terminal 7, and as such, with the proper digital control, can provide energy efficient Doherty or (N-way) outphasing operation or a mixture of both. When using a single gate-segmented power output stage 2, supply modulation can be used as energy efficiency enhancement technique. Optionally a baseband IQ representation of the actual generated TX signal can be provided off-chip for use in an external DPD.

Figure 12:
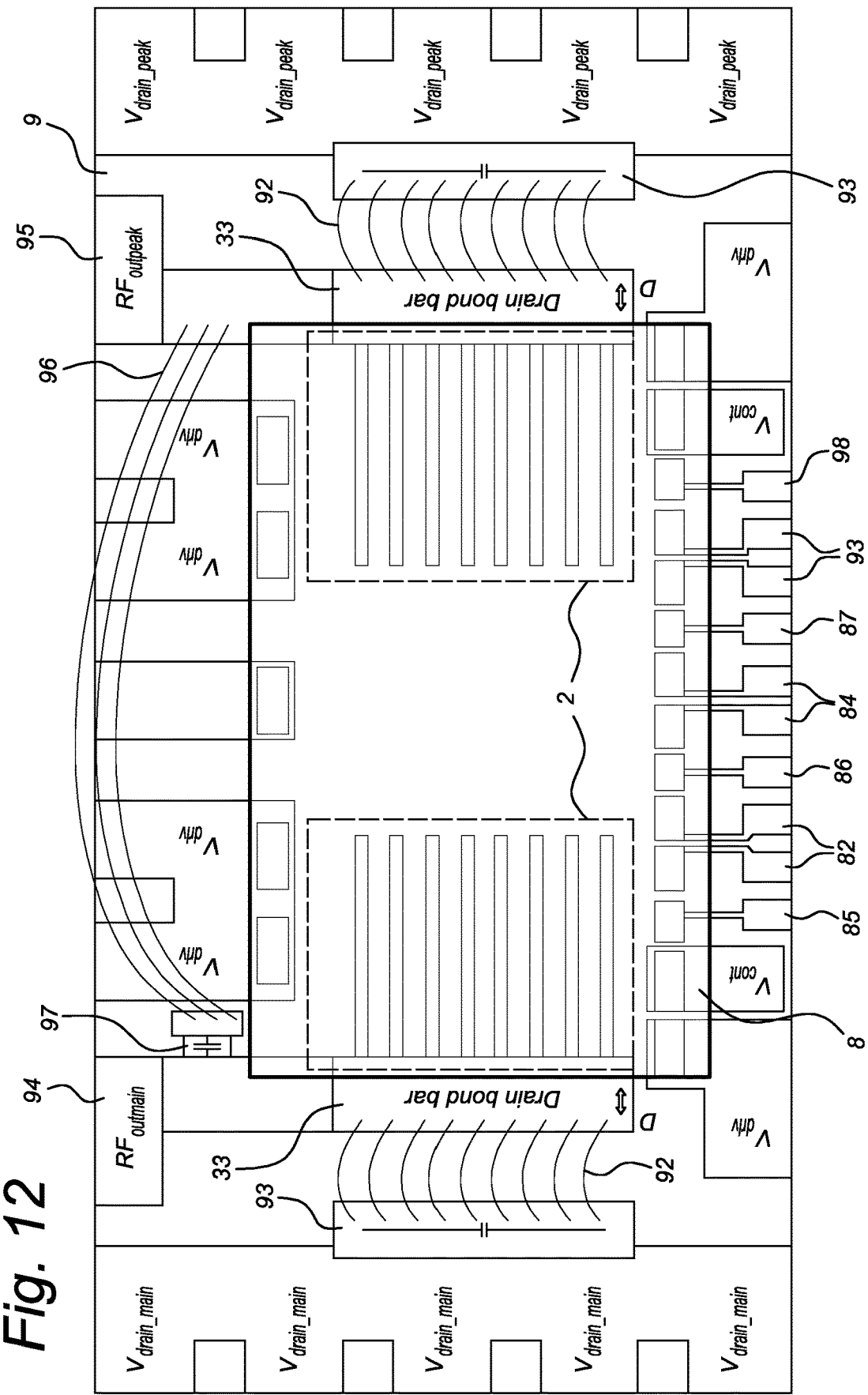
FIG. 12 shows a conceptual top view of an embodiment of a LDMOS/GaN power die with flip-chipped CMOS/SOI controller—driver, having two thermometer gate-segmented power output stages configured for Doherty operation in accordance with the present invention.

FIG. 12 gives a detailed conceptual implementation of a two-way digital Doherty RF transmitter 1 using two gate-segmented power output stages 2 (indicated by the dashed boxed contours) in a flip-chip mounting configuration with a high-speed CMOS/SOI digital driver 5 that is placed on top of an LDMOS/GaN power die 9 according to a further embodiment of the present invention. In this particular embodiment, since the CMOS digital driver 5 is flip-chip connected, all bias supplies, RF clocks, IQ data connections and RF output matching/power combiner connections need to be routed over the LDMOS/GaN power die 9.

This particular embodiment features two differential high-speed serial data interfaces (e.g. SerDes, or LVDS), of which one is used to provide baseband IQ signal (connections 82 DX1+, DX1−) to the digital RF transmitter 1, and one is used to extract a down converted IQ representation of the generated digital TX output signal and feed it to an external DPD unit (connections 83 DX2+, DX2−). The RF carrier/RF clock reference is also fed to the digital controller chip (first die 8), which is implemented in high-speed CMOS/SOI technology, using the differential connections 84 RFC+, RFC−. In addition, four control lines 85-88 are provided; C1, C2, C3, and C4 that are used to reset, load data in controlling registers (via e.g. SPI) and/or put the RF transmitter 1 in complete off-mode. Furthermore the positive supply voltages for the digital driver 5 ($V_{cont}$) and drivers/buffers ($V_{drive}$) are provided over the power die 9. This is done at multiple points as shown in FIG. 12 to allow for the best possible AC decoupling of these voltages. All the ground connections (S), extra driver supply connections (V) and contacts for the segmented gates (G) as previously given in FIG. 8 are also used to connect to the first semiconductor die 8, but are not explicitly shown in this FIG. 12. The same holds for high density bias decoupling capacitors (for $V_{drive}$ and $V_{cont}$) that can be implemented in the power die 9 MM IC, also not shown to maintain the readability of this FIG. 12. The gate-segmented power output stages 2 use a bond wire array 92 connected to the drain bond bar 33, in combination with a high-density capacitor 93 on the LDMOS die 9 to provide AC choke inductors to resonate out the output capacitance of the gate-segmented power output stages 2. The same connection is used to provide the drain supply to the gate-segmented power output stages 2. The RF output signal of the main device ($RF_{outmain}$ 94), as well as the RF output signal of the peak device ($RF_{outpeak}$ 95), can be fed to an external power combiner (e.g. one that is implemented on the PCB for configurations that target relative low TX operating frequencies), to obtain the desired output signal RF out. Alternatively, one can use also "long" bond wires 96 to connect the $RF_{outmain}$ 94 with $RF_{outpeak}$ 95 to implement a "lumped" Doherty power combiner, this latter configuration is particularly useful when targeting higher operating frequencies. When aiming to use different voltage potentials for the main and peak device, e.g. to extend the high efficiency power back-off range, these bond wires 96 should be connected to the $RF_{outmain\_AC}$, which provides DC isolation through the use of the capacitor 97. Note that some distance between the boundaries of the CMOS controller (first die 8) and the actual bonding locations will be needed in practical implementations (indicated by D).

The above described configuration offers a highly integrated, highly-efficient digital high power transmitter 1 with a large functionality and re-configurability, and offers several advantages over current-state of the art transmitters. Extended versions of the described configuration, based on the use of segmented power devices are possible and can related to: 3-way or N-way Doherty configurations, inverted Doherty configurations, mixed-mode outphasing configurations, supply modulation concepts, as well as, push-pull variations of these concepts that aim to enhance on bandwidth or spectral purity.

It is noted that the present invention embodiments may also be applied in or as push-pull embodiments of the DTX variants as discussed above. In the gate-segmented power output stage or switch bank 2 implementations, this means that adjacent drain fingers 31 are alternately assigned as push drain finger 31a or pull drain finger 31b. This is shown in the exemplary embodiments shown in the schematic diagrams of FIG. 13-16. The push drain fingers 31a are interconnected in a push drain bond bar 33a using associated connections 33d and the pull drain fingers 31b are interconnected in a pull drain bond bar 33b using associated connections 33d. In more general wording, in a further embodiment the plurality of drain fingers 31 of the gate-segmented power output stage 2 comprise interleaved drain fingers 31a, 31b in a push-pull configuration of the digitally controlled segmented RF transmitter 1.

The big advantage is that the whole structure can be kept electrically more symmetric even at the drain finger level, such that current crowding effects can be reduced or avoided, while the implementation of the bias feed can be done more effectively with greater design flexibility, yielding better decoupling and lower bias feed inductance. In addition, undesired coupling between a push-pull output stage and other output stages that are present in the design (e.g. in a Doherty configuration) can be avoided by applying a dedicated resonator for tuning out the device output capacitance, that provides self-cancelation of its electromagnetic (EM) field at larger distances. Finally the DTX approach allows a greater flexibility regarding the connections of the power stage, which can be used in making the layouts where these DTX devices are used more compact, while avoiding and/or reduce interconnect parasitics.

In the embodiments shown in FIG. 13-16, a decoupling capacitor structure 93 is provided connected to the supply voltage $V_{DD}$ of the power chip 9, the function and operation of which is similar to the high density capacitor 93 as described above with reference to the FIG. 12 embodiment. These embodiments show schematic diagrams of various implementations of an inductor cooperating with the decoupling capacitor structure 93. In generic wording, the gate-segmented power output stage 2 further comprises a push drain bar 33a connected to the associated push drain fingers 31a and a pull drain bar 33b connected to the associated pull drain fingers 31b, a power supply decoupling capacitor structure 93. Furthermore, a center tapped resonator 105 is connected on one side to the power supply decoupling capacitor structure 93 and on the other side to push drain bar 33a and pull drain bar 33b.

Figure 13:
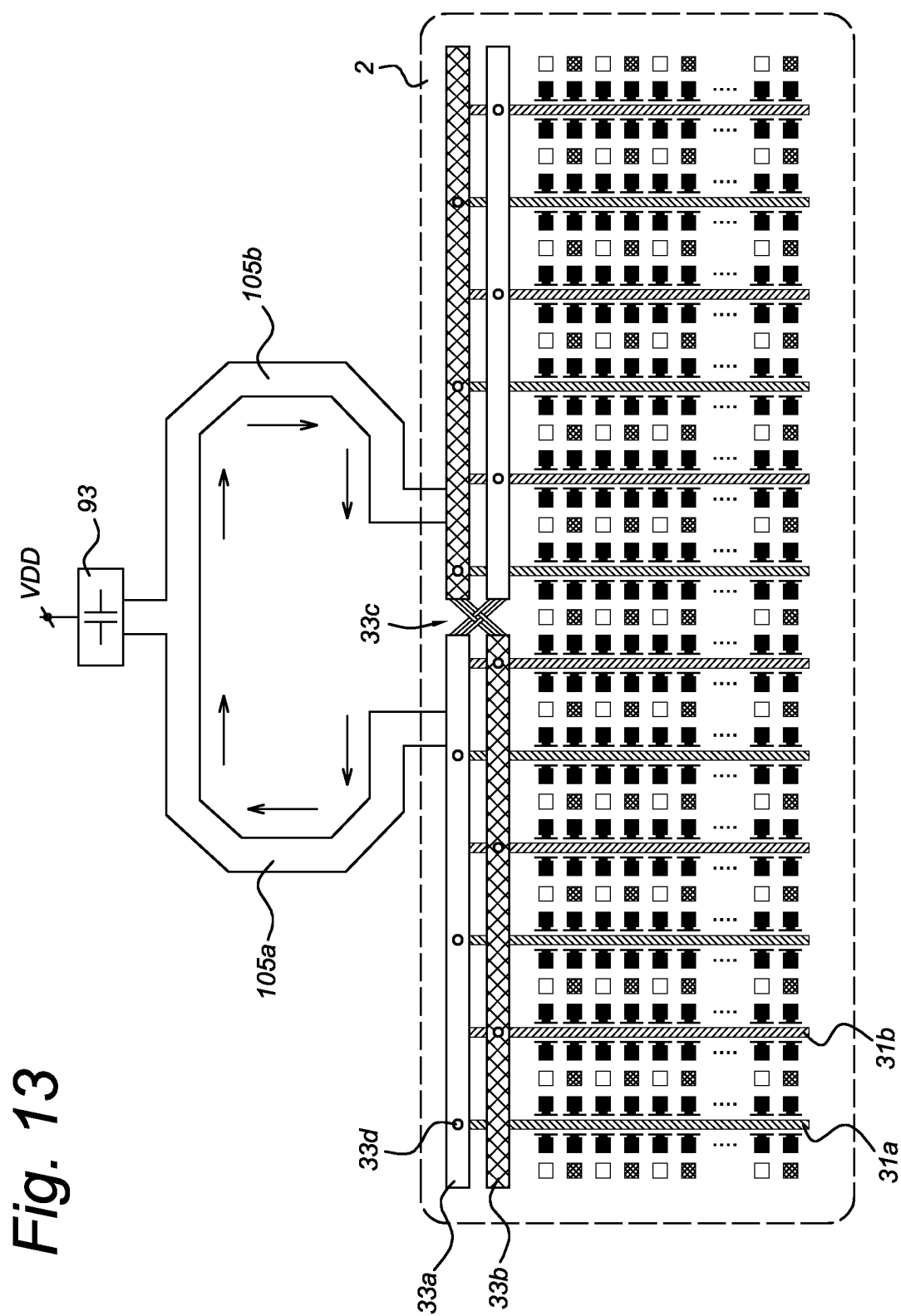
FIG. 13 shows a schematic diagram of an exemplary implementation of a switch bank in accordance with the present invention using a planar resonator.

FIG. 13 shows an implementation of a push-pull DTX with gate segmentation and an inductive center tapped planar resonator 105 to resonate the output CDS capacitances of the push-pull switch banks 2. The planar resonator 105 is connected on one side to the decoupling capacitor structure 93, and on the opposite side to both the push drain bar 33a and the pull drain bar 33b, e.g. as shown at the exact middle of the associated drain bar 33a, 33b halves. The arrows indicate the flow from the push drain bar 33a via supply decoupling capacitor structure 93 to the supply voltage $V_{DD}$ connection in a first branch 105a, and in opposite direction from the supply voltage $V_{DD}$ connection via supply decoupling capacitor structure 93 to the pull drain bar 33b in a second branch 105b.

As can be noted, the drain bars 33a, 33b with segmented gate elements 31a, 31b are now alternately devoted to the push and pull action and as such interwoven in the DTX device itself. Furthermore by keeping the device layout strictly symmetric, e.g. by using an even number of drain fingers 31a, 31b, two symmetrically cross connected drain bars 33a, 33b and a symmetrical cross connection with balanced parasitics 33c in the middle, the following advantages can be achieved.

Truly symmetric as well as compact output structure, with center tap bias feed and decoupling, will lower the effective bias feed inductance.

Supply decoupling is compact and perfectly symmetric, making it a close to ideal virtual ground for the RF carrier frequency and its odd harmonics, consequently the decoupling capacitor 93 and bias feed can be fully optimized for its baseband behavior without any concern of its behavior at the RF design frequency.

By taking the output signal perfectly differential or by using a high quality balun transferring it to a single ended signal, the even order components and sampling replica can be suppressed, which significantly improves the quality of the output spectrum of a digital intensive transmitter.

The alternating push-pull drain finger 31a, 31b structure makes it possible to also implement the driving unit cells on the CMOS/SOI controller on first die 8 directly in a push-pull/differential fashion. This reduces also the fluctuation of the bias current of these unit cells and significantly eases the supply decoupling of these drivers. Both are important in reducing bias network induced memory effects (note that also the memory effects of the gate-segment drivers play an important role here). Furthermore, since the unit cells/switch bank itself can be made push-pull/differential, timing errors that otherwise might occur in providing two physically separate clock trees to two large separated switch banks 2, that together would form a push-pull pair using an external balun, can be almost completely omitted.

Figure 14:
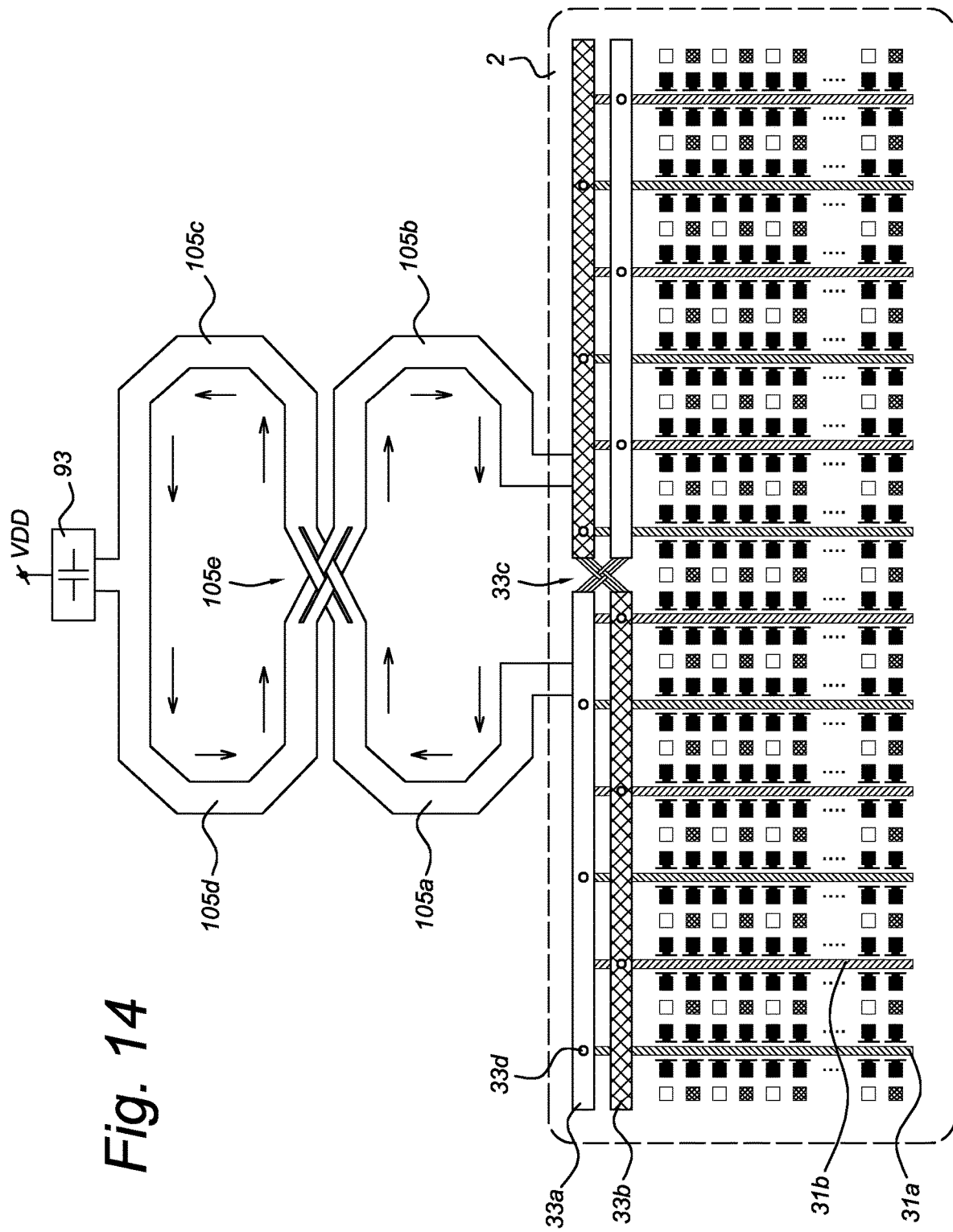
FIG. 14 shows a schematic diagram of a further exemplary implementation of a switch bank in accordance with the present invention using a planar resonator.

FIG. 14 shows an implementation of a push-pull DTX with gate segmentation and inductive center tapped planar eight shaped resonator 105 to resonate the output capacitances of the push-pull switch banks 2 while including self-cancelation of its electromagnetic radiation at medium to large distances.

Although the structure embodiment of FIG. 13 shows many advantages, its output resonator 105 creates an electromagnetic flux that might couple with other structures that are placed relatively close to this switch bank 2. Especially in higher order (N-way) Doherty configurations, where multiple switch banks 2 need to operate in close proximity and their load impedances in power back-off can be high, these coupling phenomena become more dominant and might disturb the desired Doherty operation. These phenomena are relative difficult to predict and control in practical implementations and might complicate the creation of accurate, as well as, compact transmitter designs. The implementation of FIG. 14 overcomes this problem by using an output resonator with an 8-shaped center tapped inductor 105. The eight-shaped center tapped inductor 105 comprises two planar windings, one having a first branch 105a and second branch 105b, and in addition a third branch 105c and fourth branch 105d, wherein the branches are interconnected using inductor cross connect 105e. Due to the opposite direction of the currents in the two resonator windings 105a, 105b, 105c, 105d the electromagnetic flux will cancel at medium and larger physical distances from this resonator 105. This will effectively eliminate unwanted coupling with other structures or switch banks 2 that are placed relatively close to this switch bank 2.

In even further embodiments, the inductor 105 connected between drain bar 33a, 33b and supply decoupling capacitor structure 93 is implemented using bond wire inductor branches 92a, 92b and a (planar) bond wire bar 92c.

Figure 15:
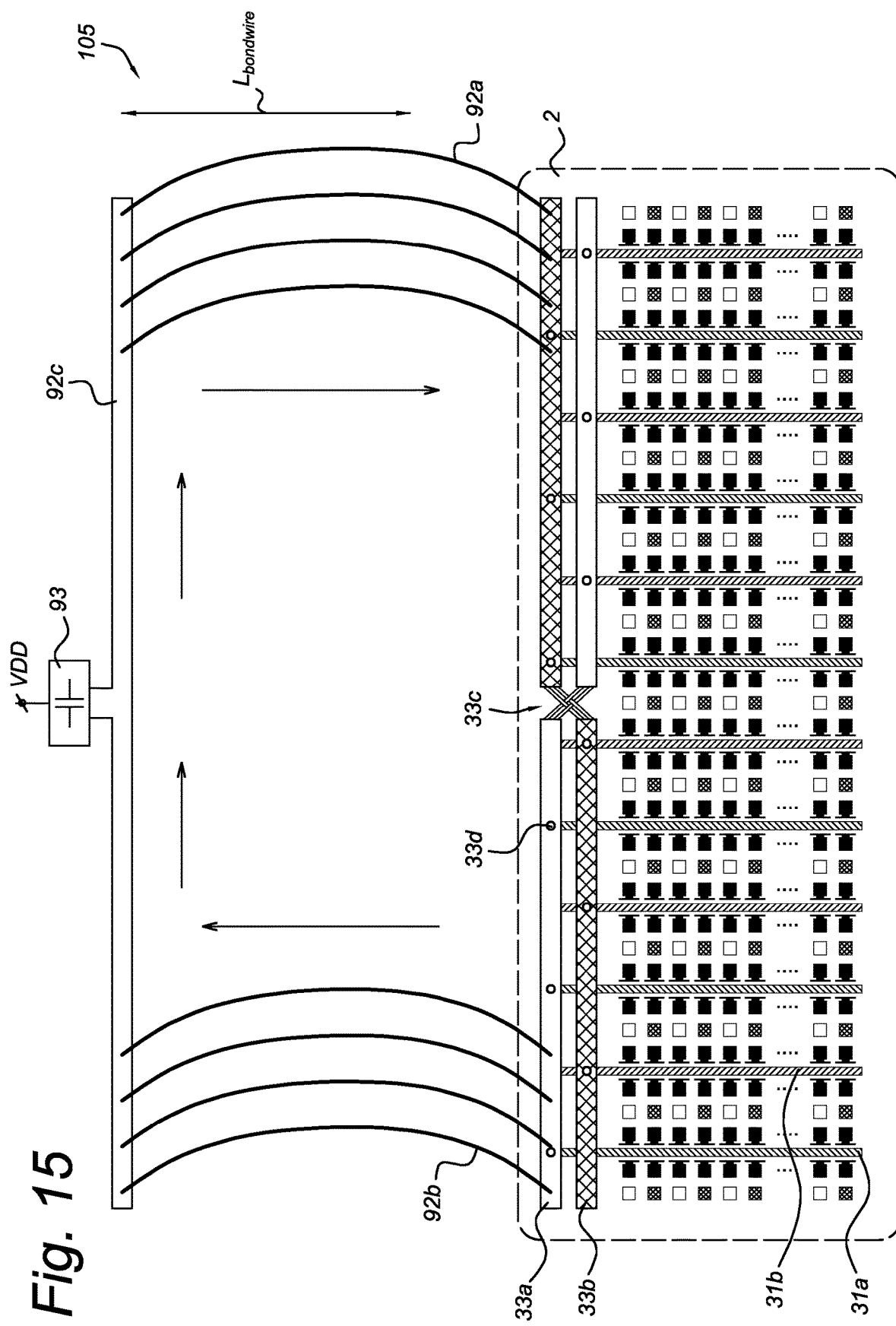
FIG. 15 shows a schematic diagram of an exemplary implementation of a switch bank in accordance with the present invention using a resonator comprising bond wires.

The implementation examples described above with reference to FIGS. 13 and 14 were planar in nature and therefore can be easily integrated in a MMIC or IC technology, including but not limited to, CMOS, SOI, LDMOS MMIC or GaN MMIC. However, their planar nature can also yield relative high RF losses for the applied resonator 105 especially in the case of highly doped substrates like the ones used in LDMOS technology. For this reason analog LDMOS power devices or MIMICS are mostly using bond wires to implement their resonators and RF connections to achieve lower losses in these passive components The structure shown in FIG. 15 shows a possible implementation of such an inductive center tapped bond wire based resonator 105 wherein bond wires 92a, 92b are used to replace some of the planar parts of the resonator embodiments of FIGS. 13 and 14 (maintain the planar bond wire bar 92c close to the supply decoupling capacitor structure 93), as such allowing to reduce the RF losses related to these metal tracks. Note that in this configuration the bond wires 92a, 92b are placed such that their electromagnetic flux constructively adds (i.e. grouped to the left and right in the FIG. 15 embodiment), this increases the effective inductance and allows to make the structure more compact, but at the increased risk of creating unwanted coupling with other structures in the close proximity of the push-pull DTX switch bank 2. Note that resonating out the output capacitance in this manner still yields considerable lateral current flow in the metal lines. In LDMOS the currents related to resonating out the decoupling capacitor structure 93 can be considerably larger than the RF output signal itself. This is the reason that the resonator 105 is placed directly in front of the bank to keep the current paths short. The RF differential signal can then be taken at one of the sides of the bank ($RF_{pull}$ and $RF_{push}$).

Figure 16:
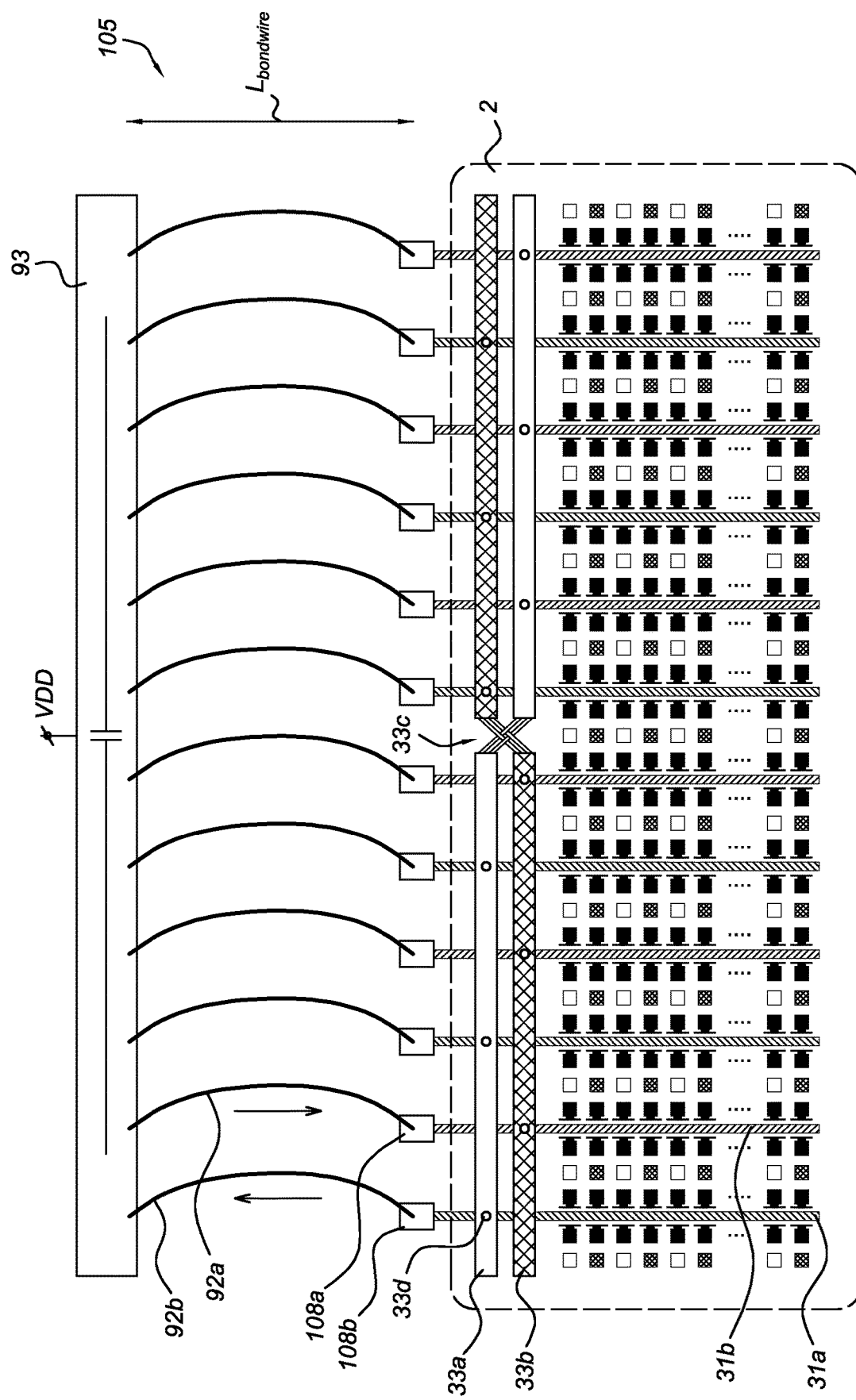
FIG. 16 shows a schematic diagram of a further exemplary implementation of a switch bank in accordance with the present invention using a resonator comprising bond wires.

A more radical way to reduce the lateral current flow in planar metal lines is shown in the next embodiment of the proposed invention as shown in FIG. 16. An implementation is shown of a push-pull DTX with gate segmentation and alternating bond wires 92a, 92b to implement the distributed inductive center tapped resonator 105 to resonate out the supply decoupling capacitor structure 93 of the push-pull switch bank 2. In this example, the bond wires 92a, 92b are connected directly to the supply decoupling capacitor structure 93 on one side, and on connection stubs 108a, 108b associated with the push drain fingers 31a and pull drain fingers 31b, respectively, on the other side.

In this version only the smaller wanted RF output current will flow laterally through the metal lines (the halves of the push drain bar 33a and pull drain bar 33b close to the switch bank 2), while the bigger resonator current that aims to cancel the impact of the output capacitance is directly handled by bond wires 92a, 92b. Due to the alternating push-pull bond wire connections 92a, 92b, virtual grounds will effectively appear between every push-pull bond wire connection, making it much more effective over the entire periphery of the device. Since this also drastically reduces the later signal flow in the decoupling capacitor structure 93, losses in this capacitor for the odd frequency components vanish/are strongly reduced and a lot of design freedom is achieved. This is especially true for the bias capacitor, which can now be optimized better to handle the baseband bias decoupling, without worrying about any RF losses at the fundamental (since the structure itself provides multiple close to perfect virtual grounds). Note that it can be chosen to use one bond wire 92a, 92b per drain finger 31a, 31b, or use sub groups of drain fingers 31a, 31b connected to a smaller number of bond wires 92a, 92b, in case the required inductance is high, yielding excessively long bond wires. These combined measures allow to reduce the memory effects for this DTX push-pull implementation. Due to the alternating current in the bond wires 92a, 92b, self-cancelation of the electromagnetic flux external to this device will occur. This lowers the risk of unwanted coupling with other structures in the close proximity of this switch bank 2, although this comes at the cost of a reduced inductance per length of the bond wires 92a, 92b, as such requiring somewhat longer bond wires 92a, 92b, which might require additional assembly considerations like using shorter bond wires in series supported by a small intermediate bond pad instead of using excessively long bond wires.

The current distribution in the proposed alternating DTX push-pull structure shown in FIG. 16 with related bond wire scheme, will be much more uniform than in an analog push-pull configuration or the push-pull DTX implementations that use two separate separated device, rather than alternating push-pull fingers, since current crowding effects will be suppressed by the alternating current flow. This uniform current distribution, will help the effective matching of the thermometer and binary bits in a DTX implementation (i.e. it provides a more accurate scaling of the DTX output signal with the digital code words that control the gate segments). In these device structure it is most logical to take the RF signals in a differential or push-pull fashion from the sides, although alternative connection schemes are also possible.

Figure 17A:
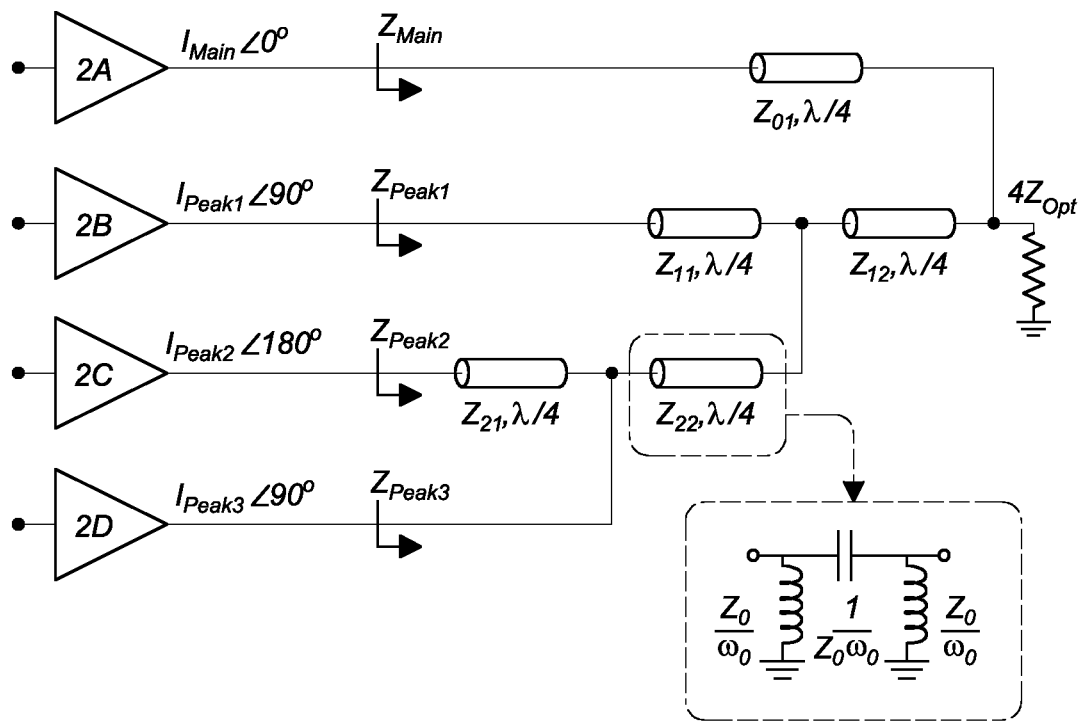
FIG. 17A shows a schematic diagram of a generic four way Doherty DTX configuration and FIG. 17B shows a schematic diagram of a four way Doherty DTX configuration according to an even further embodiment of the present invention.

In even further embodiments the proposed push-pull DTX structures can also be applied to construct very compact Doherty DTX transmitters. Multiple flavors of such a configuration are possible, but for illustration purpose here the implementation of a DTX N-way (in the example shown four way) Doherty is discussed using N switch banks (or gate-segmented power output stages) 2A-D. In this particular design, it is chosen to use identical sizes (gate-widths) of the DTX switch banks 2A-D. This saves design time and allows a more symmetrical implementation of the transmitter. FIG. 17A shows the (single-ended representation) principle schematic of a 4-way Doherty DPA having four switch banks 2A-D (also indicated as Main, Peak1, Peak2, Peak 3) with λ/4-line impedance inverters connected to each output thereof. This particular arrangement has the advantage of providing a relatively short RF path from the main I/Q DPA switch bank 2A to the load (indicated by resistor $R_L/2$ in FIG. 17A), which provides lower losses and therefore directly improves the power back-off efficiency of this Doherty DTX configuration compared to other more traditional Doherty implementations. Note that a straightforward implementation of such a transmission line Doherty amplifier, would still result in a bulky realization due to the large dimension of the transmission lines needed for such a design. These transmission lines, especially when implemented on a semiconductor die, still exhibit losses and therefore the efficiency achieved with a practical realization will still significantly deviate from its theoretical ideal performance.

To make a Doherty transmitter implementation more compact, the transmission lines in a Doherty output power combiner can also be approximated by lumped equivalent network sections. A natural way to do so is the use of low-pass network λ/4 sections (shunt-C, series-L, shunt-C) networks that provide an equivalent phase delay at its center frequency as the λ/4 transmission line. Following this concept the output capacitance of the active device can somewhat be absorbed in the low pass λ section by lowering or omitting one or both shunt-C elements, while still a comparable (traditional) network topology/layout strategy can be followed. However, even using this approach, the output capacitance of a power device/power switch bank 2A-D is typically too large to be fully absorbed by such a lumped low-pass network and therefore in practical cases still integrated shunt inductor ("inshin") arrangements are applied that are typically used to resonate out the output capacitance of the active device.

Note that in contrast to a λ/4 transmission line (distributed element), a lumped equivalent network representation of such a transmission line does not exhibit the repeated behavior with frequency that is characteristic for transmission lines. In fact it only approximates the λ/4 transmission line behavior around its center frequency. In view of this, opposite to the classical design strategy it is also possible to use high-pass equivalent "shunt-L series-C shunt-L" network elements to obtain a more compact layout for its final physical implementation.

Figure 17B:
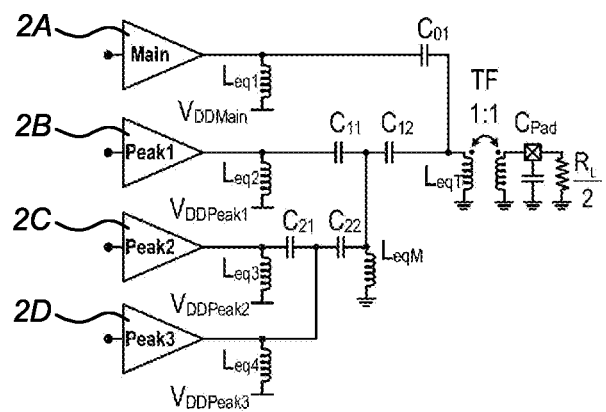
Figure 18:
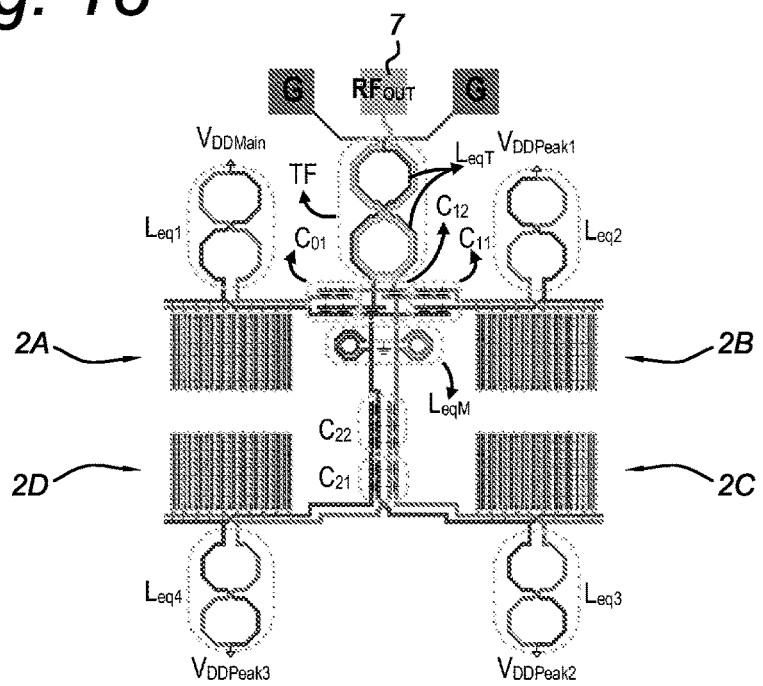
FIG. 18 shows a physical layout implementation of the four way Doherty DTX configuration.

Consequently, in the exemplary embodiment shown in FIG. 17B (single-ended representation), high-pass equivalent L-C-L networks are used to replace the λ/4 transmission line elements of FIG. 17A, with subsequent reduction of the network complexity. FIG. 18 shows the related physical layout of the proposed compact 4-way Doherty DTX configuration (push-pull) implementation, featuring resonators and a balun that provides self-cancelation of the EM fields as such avoiding unwanted EM coupling between the Doherty branches.

These introduced L-C-L networks provide a −90° phase delay (note that this is delay is opposite to the one presented by a λ/4 transmission line segment or its lumped low-pass representation, shunt-C, series-L, shunt-C, which gives a +90° delay), which requires different (unique) phase relations for the switch banks 2A-D in the DPA branches connected to the high pass Doherty power combining network. It should be stated, however, that the DTX approach in contrast to the classical analog design approach is very flexible in providing these phase relations, by simply selecting different phase relations for the upconverting LO clocks.

Note that the use of a shunt inductor $L_{eq\_i}$ (FIG. 17B) directly at the output of the switch banks 2A-D also allows to implement in a straightforward manner the biasing arrangement of the switch banks 2A-D and it can be combined/merged with the "inshin" arrangements that are typically used to resonate out the output capacitance of the active device as discussed below.

Furthermore, the use of a series C in the high pass section, will providing electrical isolation to the other switch banks 2A-D. The later allows the use of different supply voltages for the individual switch banks 2A-D (indicated as $V_{DDMain}$, $V_{DDPeak1}$, $V_{DDPeak2}$, $V_{DDPeak3}$ in FIGS. 17A, 17B and 18), a technique that can help to improve the efficiency at even deeper power back off conditions. Again the non-repetitive nature of the lumped approach in comparison with the classical transmission line approach need to be stressed. It is this different frequency dependence, compared to transmission lines, for the higher harmonics that can work out to be very beneficial in avoiding unwanted resonance phenomena in wideband Doherty implementations.

DTX implementations have, due to their switching nature, higher harmonic content than traditional analog implementations. Interaction between Doherty switch banks 2A-D, other than the desired interaction at the fundamental, yields often to undesired performance fluctuations in both output power and efficiency vs. frequencies, which as such limits the effective bandwidth of the such a Doherty DTX configuration. It has been shown that also resonances may be avoided by featuring isolation of the higher harmonics between the switch banks 2A-D by applying equivalent lumped network elements to implement the impedance inverting elements.

Using lumped shunt-L—series-C—shunt-L elements as replacement of the λ/4 transmission lines, the periodic behavior of transmission line based impedance inverting elements vs. frequency is avoided, yielding suppression of these "resonance" dips and as such avoids bandwidth degradation. In the DTX implementation using multiple switch banks 2A-D as shown in the exemplary embodiment of FIG. 17B, it can also be beneficial to replace the series C in the high pass section by a series LC "resonator" combination that provides the same susceptance at the fundamental frequency as the original series C in the high-pass section. Doing so the isolation of the harmonics between the switch banks 2A-D can be further improved. The proposed approach can be of also of use in bridging a physical distance between the various switch banks 2A-D, since the inductive element of the LC resonator can be implemented as a high impedance (thin) transmission line.

In this particular Doherty DTX design the four identical DTX switch banks 2A-D have the same maximum RF output current ($I_{max}$) but utilize different activation points and slopes to implement the Doherty operation. By using the proper activation moments, slopes and phase relations for the DTX switch banks 2A-D, their output currents combined in phase within the 4-way DPA combiner will yield the desired active-load modulation and intended 4-way Doherty operation Employing the high pass sections in this particular design consolidates and combines these elements into only four inductors $L_{eq1} \ldots L_{eq4}$ that resonate with the associated switch bank 2A-D output capacitance and provide biasing, and only one extra inductor $L_{eqM}$ and output balun TF as shown in FIG. 17B (single ended representation), allows a very compact implementation of the power combiner. Since this layout can be so compact there is a severe risk that the inductors would suffer from undesired coupling among them. Consequently, additional features are applied by introducing eight shaped resonators that provide self-cancellation of their electromagnetic field (similar to the exemplary embodiments shown in and described with reference to FIG. 14). In the exemplary embodiment of FIG. 18, a push-pull 0.5 W CMOS 4-way Doherty DTX with 8-shaped inductors $L_{eq1-4,M}$ and balun TF with inductor $L_{eqT}$ is shown, in their arrangement with capacitors and the present capacitors $C_{01}$, $C_{11}$, $C_{12}$, $C_{21}$, $C_{22}$. The inductors used provide an opposite orientation of the magnetic flux for their coil loops to avoid unwanted magnetic coupling between the closely-spaced switch banks 2A-D. In the exemplary embodiment the DTX transmitter is made extremely compact (circuit core is 1.3 mm×1.15 mm), while excellent bias arrangements with low feed inductance have been realized.

In contrast to analog implementations, by using a DTX approach the phase relations and activation of the (gate segmented) switch banks 2A-D can be implemented fully digitally, so a complicated (space consuming) analog Doherty power splitter or analog feeds at the input of the active devices is no longer needed. Consequently, also the traditional connections to the gate fingers 31 as used in analog implementation is no longer present. In fact in a DTX the activation of its gate segments or its unit cells 3a will be their drivers that are controlled by the digital clock trees and digital data controlled row and column decoders. As such, the DTX RF design is mainly focused on the optimum implementation of the output network (Doherty power combiner) and its overall layout can be made more compact.

Although the advantage of using series-LC connections in the connections between the switch banks to provide isolation of the harmonic content has been already be made clear. It can be also noted that some of the connections in the layout of FIG. 18 may become relatively long (e.g. the path including C21, C22). These lengthy connections will (especially on high doped substrates like in CMOS and LDMOS technologies) contribute to losses in the Doherty power combining network. Also the balun TF, which here is placed between the eight shaped resonators $L_{eq1}$, $L_{eq2}$ of the main and peak1 switch bank 2A, 2B, due to the substrate will contribute to losses. Consequently, although similar design techniques can also be applied in LDMOS or GaN DTX transmitters. The much higher power levels in these implementations (e.g. ~50 W RF peak output power for an LDMOS implementation, compared to the ~0.5 W for the previous discussed CMOS implementation) demand that the losses in the output power combiner and (inshin) PA output resonators should be kept to the absolute minimum. Furthermore, the dimensions of the switch banks in an LDMOS/GaN implementation are much larger (e.g. a factor 10 larger than in the previous discussed CMOS example), and as such become also electrically large, manifesting all kind of distributed effects. In short, high-power LDMOS/GaN DTX implementations ask for even more novel design solutions to optimize their performance.

To create more design flexibility in the layout for implementing an even more compact Doherty power combiner for high power applications, the DTX approach, in stark contrast with an analog implementation, allows us to put the resonator, used to cancel out the switch bank capacitance, to the opposite (back) side of the drain fingers 31a, 31b, as is illustrated by the exemplary embodiment shown in FIG. 19 (quite similar to the FIG. 16 embodiment). Note that the connection stubs 108a, 108b of the push-pull resonator are now positioned and connected to the drain fingers 31a, 31b on the opposite side of the push and pull drain bars 33a 33b. As such separating the position of the resonator and the actual RF outputs. Note that a similar design approach can be used for single-ended DTX implementations. For electrically large switch bank implementations, it can be beneficial for this topology with a backside drain finger connected resonator, to add an extra (push-pull) drain bar connection at the end of the drain fingers at the point where the ("inshin") resonator is connected (not shown in drawing) this to keep the RF potential for these drain fingers as much as possible constant over the device. This will be most beneficial for single ended switch banks 2 that suffer more from current crowding effects, in comparison to the push-pull version using interleaved push and pull fingers 31a, 31b.

Figure 20:
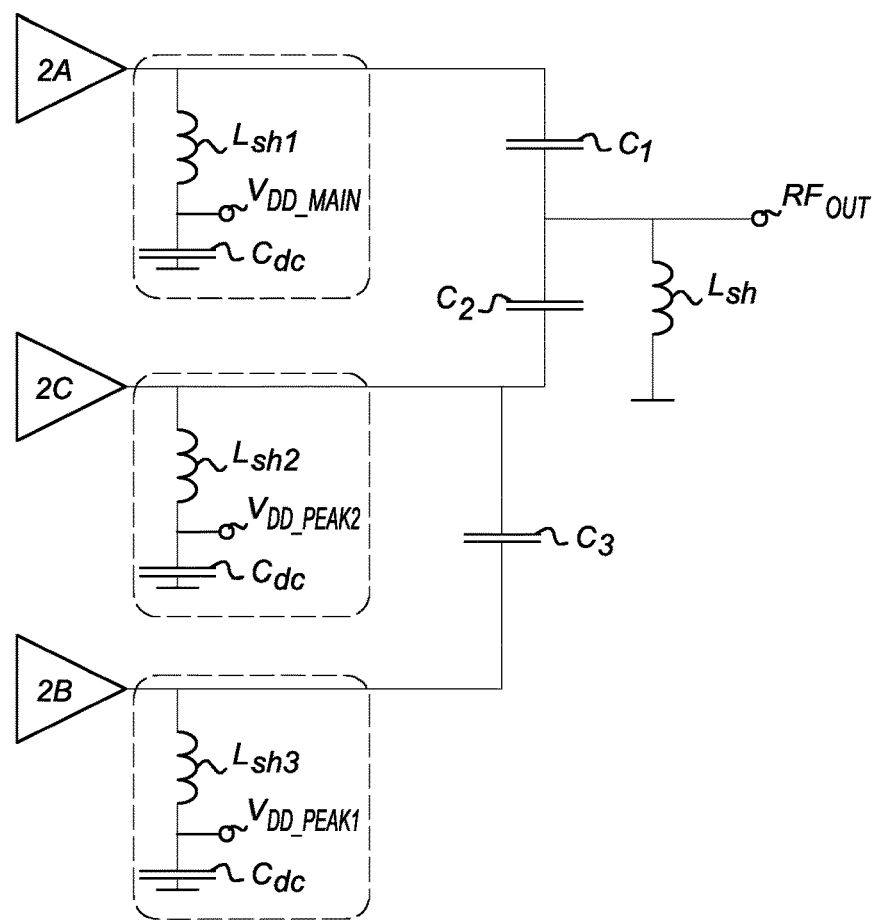
FIG. 20 shows a schematic diagram of a three way Doherty DTX configuration according to an even further embodiment of the present invention.
Figure 21:
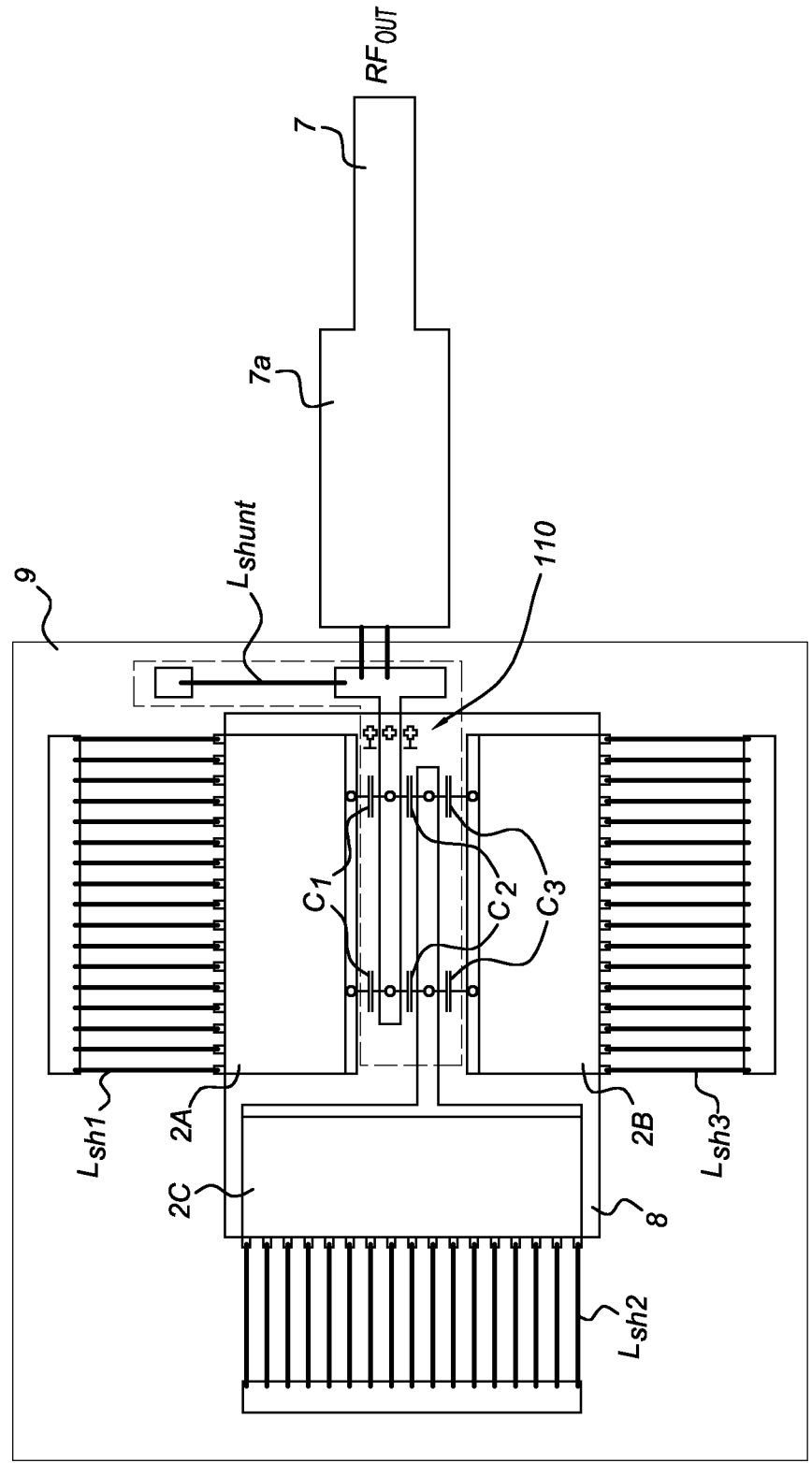
FIG. 21 shows a physical layout implementation of the three way Doherty DTX configuration of FIG. 20.

A further exemplary embodiment is described below with reference to FIGS. 20 and 21, wherein FIG. 20 shows a schematic diagram of a three way Doherty DTX configuration, and FIG. 21 shows a possible physical layout implementation of the three way Doherty DTX configuration of FIG. 20. Similar to the embodiment described above with reference to FIGS. 17b and 18, in this embodiment three switch banks 2A-C are present (Main, Peak1, Peak2), with a dedicated LC-network at the output of each switch bank 2A-C and additional power combining circuitry as shown. The lay-out scheme as shown in FIG. 21 allows to provide an ultra-compact layout for a high power (50 W) single-ended 3-way Doherty using gate-segmented switch banks 2A-C with the "inshin" resonators $L_{sh\ i}$, positioned to the opposite side (backside) of the drain fingers and a Doherty power combiner based on high-pass network elements $L_{shunt}$, $C_1$, $C_2$, $C_3$. This particular version uses a flip-chipped CMOS controller 8 on top of a LDMOS or GaN MMIC 9 comprising the switch banks 2A-C. Control lines and supply arrangements are not shown in this Doherty implementation featuring backside connected resonators in the layout. Thus, in a further embodiment, the RF transmitter 1 further comprises a power combiner based on lumped network elements. The lumped network elements are high-pass or band-pass elements.

Clearly this configuration allows to make the power combining network even more compact (power combining network is indicated by the dashed lines in FIG. 21), yielding lower losses, while providing more design flexibility and space to implement the switch bank "inshin" resonators $L_{sh\ i}$, while the switch bank 2A-C loading and its connections can be made more symmetrical over the DTX switch bank device (e.g. by splitting the capacitors $C_1$, $C_2$, $C_3$ in the power combining network as shown). Although, this single ended 3-way DTX arrangement does not use resonators with self-cancelling properties for their EM field (see FIG. 17/18 embodiment described above), the provided extra design flexibility in the layout by using the backside connected "inshin" resonators $L_{sh\ i}$ allows to put them as far apart as possible, with a very favorable device orientation to use an ultra-compact high-pass element based Doherty power combiner.

Another advantage of this topology is that the RF output in this MIMIC approach is now located underneath the flip-chip mounted CMOS controller 8. Therefore, the output signal can be directly monitored by this controller using a flip chip connection to the RF output (indicated as $RF_{monitor}$ 110). Note that this situation is not so easy to achieve in conventional implementations, that use an (external) transmission line based power combiner, since the power combining point of the various Doherty branches that represents the actual RF output signal is not always directly accessible by an electronically short connection from the CMOS controller 8, yielding difficulties in measuring the output quantity accurately. Also, this layout allows using an low loss output impedance matching network 7a to provide a well-defined RF output signal 7. As such this new configuration offers many new possibilities for highly integrated and digital intensive transmitters that can feature on-chip DPD correction and output stage device protection (e.g. overvoltage, temperature).

The present invention has been described above with reference to a number of exemplary embodiments as shown in the drawings. Modifications and alternative implementations of some parts or elements are possible, and are included in the scope of protection as defined in the appended claims. In summary, various embodiments of a high-power digital RF transmitter 1 (DTX) concept are provided and described above and in the attached claims, targeting e.g. low-cost, highly-integrated and energy-efficient mMIMO base stations. The present invention embodiments bridge the historical gap between low-voltage high-speed digital devices and high-voltage high-power RF devices. The resulting combination allows for a complete replacement of the traditional transmitter line-up, which includes signal-generation, up-conversion, and analog pre-drivers and power amplifier (PA), facilitating drastic energy savings and higher integration. The aimed RF transmitter embodiments are provided by combining a digital driver 5 (data-controller with high-speed digital drivers) that control the individual gate-segments of RF power transistors (power output stage segments 3) implemented in high-voltage breakdown technology like LDMOS or GaN. The power output stage segments 3 are $V_T$-shifted to make them compatible with the voltage swings that can be provided by the (low-voltage) high-speed devices in the digital driver 5 in CMOS/SOI technologies. The presented configurations with gate-segmented power output stage 2 with power output stage segments 3, advantageously use thermometer weighted segments to limit differential non-linearity (DNL) errors which arise due to current redistribution effects, among others. Consequently, a relative large number of CMOS/SOI drivers (in digital driver 5) and their associated RF-power transistor segments (power output stage segments 3), with related connections are required in order to be able to meet the spectral requirements of wireless standards. For binary weighted segments (if any are still added to increase the resolution) timing and/or phase errors are reduced by equalizing their loading conditions to the digital driver 5 compared to the thermometer bits. Furthermore, further adjustments to the power output stage segments 3 were described to optimize RF transmitter 1 operation, including gate segmentation, drain and source finger sharing, as well as, improved connection schemes and decoupling for edge and flip-chip oriented high-power DTX implementations that are made compatible to N-way Doherty operation.

REFERENCES

[1] Morteza Alavi, Robert Bogdan Staszewski, L. C. N. de Vreede, Akshay Vissweswaran, and John Long, "All Digital RF I/Q Modulator," IEEE MTT, vol. 60 issue 11, pp. 3513-3526, 2012.
[2] Mohsen Hashemi, Yiyu Shen, Mohammadreza Mehrpoo, Morteza S. Alavi, Leo C. N. de Vreede, "An Intrinsically Linear Wideband Polar Digital Power Amplifier", IEEE Journal of Solid-State Circuits, Year: 2017, Volume: 52, Issue: 12, Pages: 3312-3328.
[3] High efficiency transmitter, patent US20130058435A1 https://patents.google.com/patent/US20130058435A1/en
[4] Yiyu Shen, Mohammadreza Mehrpoo, Mohsen Hashemi, Michael Polushkin, Lei Zhou, Mustafa Acar, Rene van Leuken, Morteza S. Alavi, Leo de Vreede, Fully-Integrated Digital-Intensive Polar Doherty Transmitter, 2017 IEEE Radio Frequency Integrated Circuits Symposium (RFIC), Year: 2017, Pages: 196-199.
[5] M. P. van der Heijden et al., "A 19W high-efficiency wide-band CMOS-GaN class-E Chireix RF outphasing power amplifier," in 2011 IEEE MTT-S IMS, June 2011, pp. 1-4.
[6] V. Diddi et al., "Broadband digitally-controlled power amplifier based on CMOS/GaN combination," in 2016 IEEE RFIC, May 2016, pp. 258-261.
[7] Ayad Ghannam, Niek van Haare, Julian Bravin, Elisabeth Brandi, Birgit Brandstatter, Hannes Klingler, Benedikt Auer, Philippe Meunier, Sebastiaan Kersjes, Ultra-thin QFN-Like 3D Package with 3D Integrated Passive Devices, 2019 IEEE 69th Electronic Components and Technology Conference (ECTC).

The invention claimed is:
1. An RF transmitter, comprising:
a gate-segmented power output stage comprising a field-effect transistor having a plurality of gate fingers and a plurality of drain fingers that define a gate periphery, the field-effect transistor comprising a plurality of power output stage segments that each correspond to a respective part of the gate periphery and that each have a respective power output stage segment input; and
a digital driver having control outputs which are connected to corresponding ones of the respective power output stage segment inputs, the digital driver being configured for individually switching each of the power output stage segments between an on-mode and a cut-off mode in dependence of one or more input signals to obtain a modulated RF carrier signal at an output of the gate-segmented power output stage.
2. The RF transmitter according to claim 1, wherein one or more adjacently arranged gate fingers are grouped into a respective gate segment, wherein each power output stage segment corresponds to one or more gate segments.
3. The RF transmitter according to claim 1, wherein the one or more gate fingers are arranged in a pattern consisting of parallel rows, wherein at least one row comprises a plurality of gate fingers, wherein the gate fingers in the at least one row are aligned such that their width directions are in line.
4. The RF transmitter according to claim 3, wherein each row is associated with an active area that is continuous in the width direction such that a single active area is provided for each row, wherein the active area corresponds to all gate fingers in that row.
5. The RF transmitter according to claim 1, wherein adjacent power output stage segments share a drain finger.
6. The RF transmitter according to claim 1, wherein all drain fingers extend from a drain bar.
7. The RF transmitter according to claim 6, wherein an operational frequency of the RF transmitter ranges from 1 GHz to 50 GHZ, and for which an absolute phase difference for signals propagating via adjacent power output stage segments from the respective power output stage segment input to the drain bar is less than 5 degrees at the operational frequency for each pair of adjacent power output stage segments.
8. The RF transmitter according to claim 1, wherein the on-mode of a power output-stage segment comprises a saturation state of the power output-stage segment.
9. The RF transmitter according to claim 1, wherein the digital driver and gate-segmented power output stage are implemented in different semiconductor technologies.
10. The RF transmitter according to claim 9, wherein the digital driver comprises a CMOS or SOI implemented digital driver.
11. The RF transmitter according to claim 9, wherein the gate-segmented power output stage comprises transistors of a laterally diffused metal-oxide-semiconductor (LDMOS) transistor type, and/or a GaN-based field-effect transistor type.
12. The RF transmitter according to claim 11, wherein the transistors of the gate-segmented power output stage are configured to have a threshold voltage for allowing the digital driver to individually switch each of the power output stage segments between the on-mode and cut-off mode in dependence of the control outputs.
13. The RF transmitter according to claim 1, further comprising a plurality of level shifters connected in between the control outputs of the digital driver and the power output stage segment inputs of the gate-segmented power output stage.
14. The RF transmitter according to claim 1, wherein the digital driver is provided in a first semiconductor die, and the gate-segmented power output stage is provided in a second semiconductor die, the first semiconductor die being different from the second semiconductor die,
the digital driver comprising a plurality of output terminals associated with the control outputs, the gate-segmented power output stage comprising a plurality of input terminals associated with each power output stage segment input, further comprising connections between respective output terminals on the first semiconductor die and associated input terminals on the second semiconductor die.

15. The RF transmitter according to claim 14, wherein the output terminals on the first semiconductor die and the input terminals on the second semiconductor die are provided in an edge part of the first semiconductor die and second semiconductor die, respectively.

16. The RF transmitter according to claim 14, wherein the connections comprise one or more of: bond wires, interconnect film connections and flip-chip type connections.

17. The RF transmitter according to claim 14, wherein the connections further comprise a plurality of ground connections between the first semiconductor die and second semiconductor die.

18. The RF transmitter according to claim 14, wherein the output terminals and input terminals are directly connected to the control outputs and power output stage segment inputs, respectively.

19. The RF transmitter according to claim 14, wherein a pitch distance between the output terminals on the first semiconductor die is substantially equal to a pitch distance between the input terminals on the second semiconductor die.

20. The RF transmitter according to claim 14, further comprising external terminals provided on the second semiconductor die.

21. The RF transmitter according to claim 1, wherein at least a part of the power output stage segments has similar transistor dimensions, and the digital driver comprises a thermometer bit style interface to the gate-segmented power output stage.

22. The RF transmitter according to claim 21, wherein a further part of the power output stage segments has unequal transistor dimensions, and the digital driver comprises a binary bit word style interface to the gate-segmented power output stage.

23. The RF transmitter according to claim 21 wherein the digital driver is arranged to implement dithering of one or more bits of the gate-segmented power output stage.

24. The RF transmitter according to claim 1, wherein the plurality of drain fingers of the gate-segmented power output stage comprise interleaved drain fingers in a push-pull configuration of the digitally controlled segmented RF transmitter.

25. The RF transmitter according to claim 24, wherein the gate-segmented power output stage further comprises a push drain bar connected to the associated push drain fingers and a pull drain bar connected to the associated pull drain fingers, a power supply decoupling capacitor structure, and a center tapped resonator connected on one side to the power supply decoupling capacitor structure and on the other side to push drain bar and pull drain bar.

26. The RF transmitter according to claim 25, wherein the resonator is a planar resonator, an eight-shaped resonator, or comprises bond wire inductor branches.

27. The RF transmitter according to claim 1, wherein the RF transmitter is a N-way Doherty transmitter having two or more gate-segmented power output stages.

28. The RF transmitter according to claim 27, wherein the RF transmitter further comprises a power combiner based on lumped network elements.

* * * * *